(12) United States Patent
Furuta et al.

(10) Patent No.: US 10,593,864 B2
(45) Date of Patent: Mar. 17, 2020

(54) PIEZOELECTRIC ELEMENT OSCILLATORY WAVE MOTOR AND OPTICAL APPARATUS

(71) Applicant: CANON KABUSHIKI KAISHA, Tokyo (JP)

(72) Inventors: Tatsuo Furuta, Machida (JP); Hiroshi Saito, Kawasaki (JP); Makoto Kubota, Yokohama (JP); Kenichi Akashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 540 days.

(21) Appl. No.: 15/298,011

(22) Filed: Oct. 19, 2016

(65) Prior Publication Data
US 2017/0040528 A1 Feb. 9, 2017

Related U.S. Application Data

(63) Continuation of application No. 14/128,519, filed as application No. PCT/JP2012/066466 on Jun. 21, 2012, now Pat. No. 9,509,235.

(30) Foreign Application Priority Data

Jun. 27, 2011 (JP) ................................. 2011-141470

(51) Int. Cl.
*H01L 41/22* (2013.01)
*H01L 41/31* (2013.01)
(Continued)

(52) U.S. Cl.
CPC ............ *H01L 41/312* (2013.01); *B82Y 30/00* (2013.01); *C04B 35/4682* (2013.01);
(Continued)

(58) Field of Classification Search
CPC ... H01L 41/047; H01L 41/18; H01L 41/1871; H01L 41/1873; H01L 41/253;
(Continued)

(56) References Cited

U.S. PATENT DOCUMENTS 5,592,041 A * 1/1997 Kasuga ................. H02N 2/142
310/316.02
6,382,522 B2 * 5/2002 Tomkins ............... A01M 1/205
239/102.1
(Continued)

FOREIGN PATENT DOCUMENTS

JP 10284763 A * 10/1998 ........... H01L 41/083

*Primary Examiner* — Thomas M Dougherty
(74) *Attorney, Agent, or Firm* — Canon U.S.A., Inc. IP Division

(57) ABSTRACT

A piezoelectric element that can decrease the output voltage for detection relative to the input voltage for driving without requiring a step-down circuit between a detection phase electrode and a phase comparator and an oscillatory wave motor including the piezoelectric element are provided. A piezoelectric element includes a piezoelectric material having a first surface and a second surface, a common electrode disposed on the first surface, and a drive phase electrode and a detection phase electrode disposed on the second surface. An absolute value $d(1)$ of a piezoelectric constant of the piezoelectric material in a portion (1) sandwiched between the drive phase electrode and the common electrode and an absolute value $d(2)$ of a piezoelectric constant of the piezoelectric material in a portion (2) sandwiched between the detection phase electrode and the common electrode satisfy $d(2)<d(1)$. An oscillatory wave motor includes this piezoelectric element.

20 Claims, 8 Drawing Sheets

(51) Int. Cl.
*B82Y 30/00* (2011.01)
*H01L 41/047* (2006.01)
*C04B 35/46* (2006.01)
*H01L 41/312* (2013.01)
*H01L 41/187* (2006.01)
*C04B 35/468* (2006.01)
*H02N 2/16* (2006.01)
*C04B 35/49* (2006.01)
*C04B 35/495* (2006.01)
*C04B 35/626* (2006.01)
*C04B 35/634* (2006.01)
*H01L 41/253* (2013.01)
*H02N 2/14* (2006.01)
*H01L 41/18* (2006.01)
*H01L 41/29* (2013.01)
*H02N 2/10* (2006.01)
*H01L 41/257* (2013.01)
*G02B 7/08* (2006.01)

(52) U.S. Cl.
CPC ............ C04B 35/49 (2013.01); C04B 35/495 (2013.01); C04B 35/6261 (2013.01); C04B 35/62685 (2013.01); C04B 35/63416 (2013.01); H01L 41/047 (2013.01); H01L 41/18 (2013.01); H01L 41/1871 (2013.01); H01L 41/1873 (2013.01); H01L 41/253 (2013.01); H01L 41/257 (2013.01); H01L 41/29 (2013.01); H02N 2/103 (2013.01); H02N 2/142 (2013.01); H02N 2/163 (2013.01); *C04B 2235/3201* (2013.01); *C04B 2235/3208* (2013.01); *C04B 2235/3215* (2013.01); *C04B 2235/3232* (2013.01); *C04B 2235/3236* (2013.01); *C04B 2235/3244* (2013.01); *C04B 2235/3248* (2013.01); *C04B 2235/3251* (2013.01); *C04B 2235/3262* (2013.01); *C04B 2235/3298* (2013.01); *C04B 2235/442* (2013.01); *C04B 2235/449* (2013.01); *C04B 2235/5445* (2013.01); *C04B 2235/5454* (2013.01); *C04B 2235/656* (2013.01); *C04B 2235/6562* (2013.01); *C04B 2235/6567* (2013.01); *C04B 2235/768* (2013.01); *G02B 7/08* (2013.01); *Y10T 29/42* (2015.01)

(58) Field of Classification Search
CPC ..... H01L 41/257; H01L 41/29; H01L 41/312; B82Y 30/00; C04B 35/4682; C04B 35/49; C04B 35/495; C04B 35/6261; C04B 35/62685; C04B 35/63416; H02N 2/103; H02N 2/142; H02N 2/163
USPC ........ 310/357, 365; 264/435, 436; 29/25.35; 501/134; 252/62.9 R, 62.9 PZ
See application file for complete search history.

(56) References Cited

U.S. PATENT DOCUMENTS

| | | | | |
|---|---|---|---|---|
| 7,443,085 | B2* | 10/2008 | Nagaya | C01G 33/006 257/347 |
| 7,944,126 | B2* | 5/2011 | Tanaka | C04B 35/4682 310/358 |
| 2002/0118492 | A1* | 8/2002 | Watanabe | G11B 5/5552 360/294.4 |
| 2003/0020370 | A1 | 1/2003 | Takeuchi et al. | |
| 2006/0113879 | A1* | 6/2006 | Ren | H04R 17/00 310/366 |
| 2006/0279178 | A1* | 12/2006 | Ren | H01L 41/18 310/358 |
| 2007/0267947 | A1* | 11/2007 | Matsushita | C30B 11/00 310/358 |
| 2011/0291525 | A1* | 12/2011 | Maruyama | H02N 2/0015 310/334 |
| 2014/0125199 | A1* | 5/2014 | Furuta | C04B 35/4682 310/323.06 |
| 2015/0288298 | A1* | 10/2015 | Uebayashi | H02N 2/142 310/317 |

* cited by examiner

PIEZOELECTRIC ELEMENT OSCILLATORY WAVE MOTOR AND OPTICAL APPARATUS

The present application is a continuation of U.S. patent application Ser. No. 14/128,519, filed Dec. 20, 2013, entitled "PIEZOELECTRIC ELEMENT, OSCILLATORY WAVE MOTOR, AND OPTICAL APPARATUS", which is a National Stage filing of International Application No. PCT/JP2012/066466, filed Jun. 21, 2012, the content of which each application is expressly incorporated by reference herein in its entirety. Further, the present application claims priority from Japanese Patent Application No. 2011-141470, filed Jun. 27, 2011, which is also hereby incorporated by reference herein in its entirety.

TECHNICAL FIELD

The present invention generally relates to piezoelectric elements, stators for oscillatory wave motors, oscillatory wave motors, driving control systems, optical apparatuses, and methods for making stators for oscillatory motors. In particular, it relates to a driving control system for an oscillatory-type actuator such as an oscillatory motor, in which an electromechanical energy conversion device is used to excite vibrations in a vibrating member and the resulting oscillatory energy is used to generate driving force.

BACKGROUND ART

An oscillatory-type (oscillatory wave) actuator includes an oscillator that excites driving vibrations to a ring-shaped, prolate-ellipsoid-shaped, or rod-shaped elastic member when an electrical signal, such as AC voltage, is applied to a device, such as a piezoelectric element, that converts electrical energy to mechanical energy. An example of the oscillatory-type actuator suggested heretofore is an oscillatory wave motor in which the oscillator is moved relative to an elastic member in pressure-contact with the oscillator.

A general structure of a ring-shaped oscillatory wave motor is described below as one example.

A ring-shaped oscillatory wave motor includes a piezoelectric material that has an inner diameter and an outer diameter such that the entire perimeter equals to an integral multiple of a particular length $\lambda$. A plurality of electrodes are disposed on one surface of the piezoelectric material and a common electrode is disposed on the other surface of the piezoelectric material to form a piezoelectric element.

The plurality of electrodes include two drive phase electrodes, a detection phase electrode, and non-drive phase electrode. Electric fields of opposite directions are alternately applied at a $\lambda/2$ pitch to a piezoelectric material in each of the drive phase electrode portions to conduct a polarization treatment. Accordingly, the polarity of expansion and contraction of the piezoelectric material with respect to the electric field in the same direction is reversed every $\lambda/2$ pitch. The two drive phase electrodes are spaced from each other by a distance equal to an odd multiple of $\lambda/4$. Usually, a non-drive phase electrode is formed in this gap portion so that the piezoelectric material in this portion does not vibrate and short-circuited with the common electrode via short-circuiting wires or the like.

The detection phase electrode is an electrode for detecting the oscillation state of the piezoelectric material. A strain generated in the piezoelectric material in the detection phase electrode portion is converted into an electrical signal corresponding to the piezoelectric constant of the piezoelectric material and output to the detection phase electrode.

A wire for inputting and outputting power to this piezoelectric element is formed and a diaphragm composed of an elastic material is attached to form a stator. When AC voltage is applied to one of the drive phase electrodes of the stator, a standing wave having a wavelength $\lambda$ occurs throughout the entire perimeter of the diaphragm. When AC voltage is applied only to the other drive phase, a standing wave occurs in a similar manner but the position of the standing wave is rotationally shifted in the circumferential direction by $\lambda/4$ with respect to the standing wave mentioned earlier.

A ring-shaped elastic member is brought into pressure-contact with a surface of the stator opposite to the diaphragm to form a ring-shaped oscillatory wave motor.

Another type of oscillatory wave motor is an oscillatory motor in which electrodes and a diaphragm are attached to inner and outer sides of a ring-shaped piezoelectric material. This type of motor can be driven by the rotation of a rotor in pressure-contact with the inner or outer side, the rotation being caused by expansion and contraction (vibration) of the piezoelectric material.

When AC voltages having the same frequency and a time phase difference of $\pi/4$ are applied to the respective drive phase electrodes of the oscillatory wave motor, standing waves are combined, and a travelling wave (wavelength $\lambda$) of bending vibrations travelling in the circumferential direction occurs in the diaphragm.

During this process, the points that lie on the rotor-side diaphragm undergo a type of elliptical motion and the rotor rotates due to the frictional force from the diaphragm in the circumferential direction. The direction of rotation can be reversed by switching the phase difference between the AC voltages applied to the respective drive phase electrodes between plus and minus.

A control circuit is connected to the oscillatory wave motor to form a driving control system that can control the speed of rotation. This control circuit includes a phase comparator that compares the phases and outputs a voltage value corresponding to the result of comparison.

When an oscillatory wave motor is driven, an electrical signal output from the detection phase electrode is input to a phase comparator along with an electrical signal applied to the drive phase electrode. The phase comparator outputs phase difference so that the degree of deviation from a resonant state can be detected. The data is used to determine the electrical signal applied to the drive phase electrode and to generate a desired travelling wave so that the rotation speed of the rotor can be controlled.

However, the value of voltage output from the detection phase electrode is usually larger than the input upper threshold voltage value of the phase comparator. Accordingly, the oscillatory wave motor control system disclosed in PTL 1 provides a mechanism (step-down circuit) between the detection phase electrode and the phase comparator to decrease the voltage to a logic level.

CITATION LIST

Patent Literature

PTL 1 Japanese Patent Laid-Open No. 62-85684

SUMMARY OF INVENTION

Technical Problem

In recent years, various motors including electromagnetic motors are increasingly required to use low-cost parts and achieve size reduction. Accordingly, oscillatory wave motors are also required to use fewer parts such as step-down circuits.

Short-circuiting wires for shorting electrodes provided on the upper and lower sides of non-drive phases may break due to vibrations and may decrease the yield and thus are desirably omitted to maintain high-quality.

The present invention addresses such a challenge by providing a piezoelectric element that can decrease the output voltage for detection relative to the input voltage for driving without requiring a step-down circuit between a detection phase electrode and a phase comparator which has been required in the related art. A stator for an oscillatory wave motor, an oscillatory wave motor, and an oscillatory wave motor driving control system are also provided.

Solution to Problem

A first aspect of the invention provides a piezoelectric element that includes a piezoelectric material having a first surface and a second surface, a common electrode disposed on the first surface of the piezoelectric material, and a drive phase electrode and a detection phase electrode disposed on the second surface of the piezoelectric material. An absolute value d(1) of a piezoelectric constant of the piezoelectric material in a portion (1) sandwiched between the drive phase electrode and the common electrode and an absolute value d(2) of a piezoelectric constant of the piezoelectric material in a portion (2) sandwiched between the detection phase electrode and the common electrode satisfy a relationship, d(2)<d(1).

A second aspect of the invention provides a stator for an oscillatory wave motor. The stator includes the piezoelectric element according to the first aspect, the piezoelectric element having a first surface including the common electrode and a second surface including the drive phase electrode and the detection phase electrode; a diaphragm disposed on the first surface of the piezoelectric element; and a power input/output wire disposed on the second surface of the piezoelectric element.

A third aspect of the invention provides an oscillatory wave motor that includes the stator according to the second aspect.

A fourth aspect of the invention provides a driving control system that includes the oscillatory wave motor according to the third aspect.

A fifth aspect of the invention provides 1 method for making the stator for an oscillatory wave motor according to the second aspect. The method includes step (A) of forming a common electrode on a first surface of a piezoelectric material, forming polarizing electrodes on a second surface of the piezoelectric material so as to sandwich the piezoelectric material between the common electrode and the polarizing electrodes, and applying voltage to polarize the piezoelectric material and obtain a piezoelectric element; and step (B) of joining the polarizing electrodes to form at least a drive phase electrode, a detection phase electrode, and a non-drive phase electrode, and then bonding a power input/output wire to a surface of the detection phase electrode or the non-drive phase electrode at a temperature equal to or more than a depolarization temperature Td of the piezoelectric material.

Advantageous Effects of Invention

According to the present invention, a piezoelectric element that can decrease the output voltage for detection relative to the input voltage for driving without requiring a step-down circuit, which has been required in the related art, between a detection phase electrode and a phase comparator can be provided. A stator for an oscillatory wave motor, an oscillatory wave motor, and an oscillatory wave motor driving control system can also be provided.

DESCRIPTION OF EMBODIMENTS

Embodiments of the invention will now be described. Although in the description below, a ring-shape oscillatory wave motor is described as an embodiment implementing the invention, the invention is not limited to the ring-shape oscillatory wave motor and may be applied to any other suitable types of motors such as multilayer oscillatory wave motors and rod-shaped oscillatory wave motors.

A piezoelectric element according to one embodiment includes a piezoelectric material having a first surface and a second surface, a common electrode disposed on the first surface of the piezoelectric material, and a drive phase electrode and a detection phase electrode disposed on the second surface of the piezoelectric material. The absolute value d(1) of a piezoelectric constant of the piezoelectric material in a portion (1) sandwiched between the drive phase electrode and the common electrode and the absolute value d(2) of a piezoelectric constant of the piezoelectric material in a portion (2) sandwiched between the detection phase electrode and the common electrode satisfy the relationship d(2)<d(1).

Figure 1A:
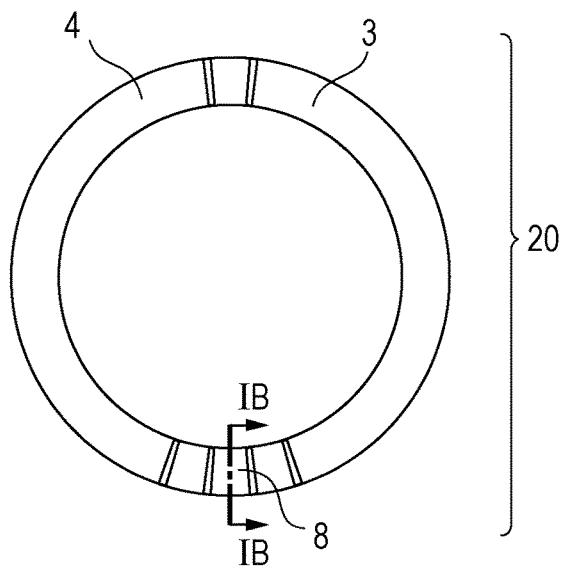
FIGS. 1A to 1C are schematic views showing a piezoelectric element according to an embodiment of the invention.
Figure 1B:
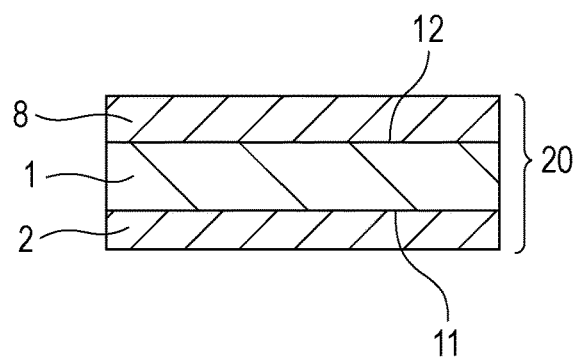
Figure 1C:
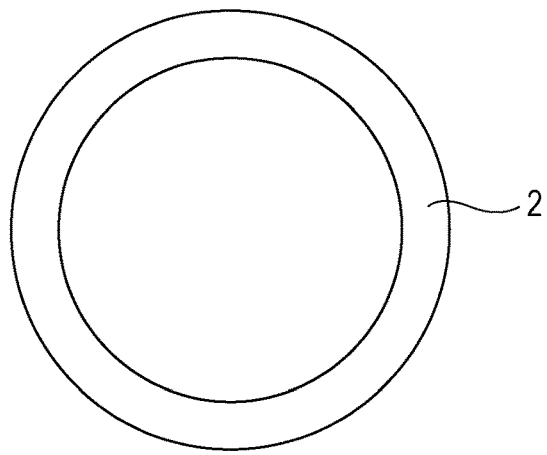

FIGS. 1A to 1C are schematic views showing a piezoelectric element according to one embodiment. FIG. 1A is a schematic plan view of a surface of the piezoelectric element. FIG. 1B is a cross-sectional view of the piezoelectric element taken at line IB-IB in FIG. 1A. FIG. 1C is a plan view of a rear surface of the piezoelectric element.

Referring to FIGS. 1A to 1C, a piezoelectric element 20 includes a piezoelectric material 1 having a first surface 11 and a second surface 12, a common electrode 2 disposed on the first surface 11, and drive phase electrodes 3 and 4 and a detection phase electrode 8 disposed on the second surface 12. The piezoelectric material 1 is, for example, a single piece of piezoelectric material having a ring shape and a substantially uniform thickness of 0.5 mm. The drive phase electrode 3 is disposed in a first drive phase (referred to as an "A phase") and the drive phase electrode 4 is disposed in a second drive phase (referred to as a "B phase"). The detection phase electrode 8 is disposed in a detection phase.

The phrase "a single piece of piezoelectric material" describing the piezoelectric material 1 means that the piezoelectric material is a seamless, single piece of ceramic prepared by firing from a single raw material having a homogeneous composition.

The drive phase electrodes 3 and 4 and the detection phase electrode 8 are disposed on the same surface (second surface) of the piezoelectric material 1. The common electrode 2 (ground electrode) for the drive phase electrodes 3 and 4 and the detection phase electrode 8 is disposed on the opposite surface (first surface) of the piezoelectric material 1 as shown in FIG. 1C.

The piezoelectric material of the drive phases A and B are subjected to a polarization treatment of applying electric fields alternately in reversed directions at λ/2 pitches. Accordingly, the polarity of expansion and contraction for an electric field in one direction is revered every λ/2 pitch. The drive phase electrodes of the phase A and the phase B are spaced from each other by a distance equal to an odd multiple of λ/4. Here, the term "polarity of expansion and contraction" refers to the sign (+ or −) of stress-strain in the in-plane or out-of-plane direction of the piezoelectric material with respect to an electric field in a particular direction.

The detection phase electrode 8 is disposed on the second surface 12 of the piezoelectric material 1 but in a place other than where the drive phase electrodes 3 and 4 are formed. For example, the detection phase electrode 8 has a length of λ/2 in the circumferential direction.

The absolute value d(1) of the piezoelectric constant of the piezoelectric material in the portion (1) sandwiched between the drive phase electrodes 3 and 4 and the common electrode 2 and the absolute value d(2) of the piezoelectric constant of the piezoelectric material in the portion (2) sandwiched between the detection phase electrode 8 and the common electrode 2 satisfy the relationship d(2)<d(1), i.e., the absolute value d(2) is smaller than the absolute value d(1)

The portion sandwiched between the detection phase electrode 8 and the common electrode 2 refers to a region where lines perpendicular to the surfaces of the two electrodes, i.e., the detection phase electrode 8 and the common electrode 2, intersect the piezoelectric material. However, when the detection phase electrode 8 and the common electrode 2 are not parallel to each other, the portion refers to a region where lines perpendicular to two surfaces, i.e., the surface the detection phase electrode 8 and a surface of the common electrode 2 to which the detection phase electrode 8 is projected, intersect the piezoelectric material. This definition applies hereinafter to the phrase "portion sandwiched between".

The piezoelectric constant d is the amount of strain (typically expressed as d31 or d32) that occurs in a plane perpendicular to a unit electric field applied between electrodes in the case of a ring-shaped oscillatory wave motor using flexural oscillation.

The piezoelectric constant d is the amount strain (typically expressed as d33 or d15) that occurs in a direction of a unit electrode field applied between electrodes in the case of a ring-shaped oscillatory wave motor, a multilayer oscillatory wave motor, or a rod-shaped oscillatory wave motor using longitudinal oscillation or shear oscillation.

The piezoelectric constant of the piezoelectric material in a portion sandwiched between the common electrode 2 and the drive phase electrodes 3 and 4 can be measured by, for example, separating the ring-shaped piezoelectric material 1 from the diaphragm, cutting out a rectangular segment having an aspect ratio of 10×2.5×0.5 from a region near the center of each drive phase electrode, the region having the same piezoelectric polarity of expansion and contraction, and measuring the piezoelectric constant of that segment by a resonance-antiresonance method.

Because the absolute value d(2) of the piezoelectric constant of the piezoelectric material in the portion (2) (hereinafter simply referred to as the absolute value d(2)) is smaller than the absolute value d(1) of the piezoelectric constant of the piezoelectric material in the portion (1) (hereinafter simply referred to as the absolute value d(1)), the level of voltage output from the detection phase electrode 8 when the piezoelectric element 20 is operated can be made smaller than the level of voltage input to the drive phase electrodes 3 and 4.

The absolute value d(2) is preferably 0.5 times the absolute value d(1) or less, more preferably 0.001 times to 0.5 times the absolute value d(1), yet more preferably 0.001 to 0.2 times the absolute value d(1), and most preferably 0.001 to 0.1 times the absolute value d(1).

When the absolute value d(2) of the piezoelectric material in the portion (2) is 0.5 times the absolute value d(1) of the piezoelectric material in the portion (1) or less, the level of the voltage output from the detection phase electrode 8 when the piezoelectric element 20 is operated can be further lowered. For example, when the absolute value d(2) is 0.5 times the absolute value d(1), the level of voltage output from the detection phase can be expected to be 0.1 to 0.2 times the magnitude of the voltage input to the drive phase electrodes 3 and 4.

When the absolute value d(2) is 0.001 times the absolute value d(1) or more, the effect of noise on the voltage output from the detection phase can be reduced.

Figure 2A:
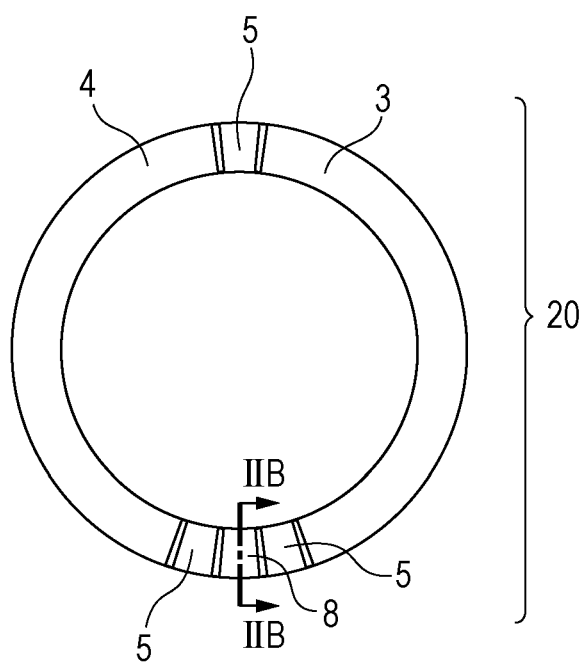
FIGS. 2A and 2B are schematic views showing a piezoelectric element according to another embodiment of the invention.
Figure 2B:
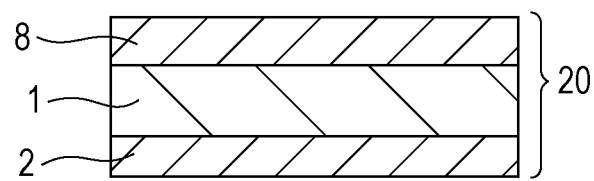

FIGS. 2A and 2B are schematic views showing a piezoelectric element according to another embodiment. FIG. 2A is a schematic plan view of the piezoelectric element and FIG. 2B is a cross-sectional view of the piezoelectric element take along line IIB-IIB in FIG. 2A.

As mentioned above, one or more gaps each equal to an odd multiple of λ/4 is formed between the drive phase electrodes and a detection phase electrode is formed in the gap.

In the piezoelectric element shown in FIGS. 2A and 2B, one or more non-drive phase electrodes 5 for preventing spontaneous piezoelectric oscillation are formed in non-drive phases in portions other than where the detection phase electrode is formed. In particular, at least one non-drive phase electrode 5 is formed on the second surface 12 of the piezoelectric material 1. The absolute value d(3) of the piezoelectric constant of the piezoelectric material in a portion (3) sandwiched between the non-drive phase electrode 5 and the common electrode 2 and the absolute value d(1) of the piezoelectric constant of the piezoelectric material in the portion (1) satisfy the relationship d(3)<d(1).

The absolute value d(3) of the piezoelectric constant of the piezoelectric material sandwiched between the non-drive phase electrode 5 and the common electrode 2 is preferably smaller than the absolute value d(1) of the piezoelectric constant of the piezoelectric material sandwiched between the common electrode 2 and the drive phase electrodes 3 and 4, as described above. The absolute value d(3) is more preferably 0.02 times the absolute value d(1) or less.

When the absolute value d(3) is smaller than the absolute value d(1), oscillation produced by the piezoelectric material in the portion having the absolute value d(3) of a piezoelectric constant is diminished during operation of the piezoelectric element 20.

Furthermore, when the absolute value d(3) is 0.02 times the absolute value d(1) or less, the oscillation produced by the piezoelectric material from the portion having an absolute value d(3) of the piezoelectric constant is further diminished during operation of the piezoelectric element 20. For example, the oscillation displacement created by the piezoelectric material in a portion having an absolute value d(3) of the piezoelectric constant can be decreased to 0.005 times the oscillation displacement for d(1) when the absolute value d(3) is 0.02 times the absolute value d(1).

In the piezoelectric element, a non-drive phase electrode satisfying the relationship d(3)<d(1) among the non-drive phase electrodes is preferably electrically independent from the common electrode.

In FIG. 2A, all of the non-drive phase electrodes 5 satisfy the relationship d(3)<d(1) and the non-drive phase electrodes 5 are electrically independent from the common electrode 2. According to this configuration, there is no need to provide short-circuiting wiring that electrically connects the non-drive phase electrodes 5 to the common electrode 2. Thus, the number of production steps is reduced and a decrease in yield resulting from failures in the short-circuiting portions is avoided.

Here, "electrically independent" means that the electrical resistance between the two electrodes is 10 kΩ or more.

The lead content in the piezoelectric material 1 of the piezoelectric element is less than 1000 ppm.

The piezoelectric material 1 contains less than 1000 ppm of lead. Most of the piezoelectric materials used in typical piezoelectric elements are piezoelectric ceramics that contain lead zirconate titanate as a main component. Thus, a possibility has been pointed out that when piezoelectric elements are discarded and exposed to acid rain or left in a severe environment, lead in the piezoelectric materials may flow into ground and adversely affect the ecosystem. However, when the lead content is less than 1000 ppm, the possibility of lead in the piezoelectric material 1 adversely affecting the environment is low even when the piezoelectric element is discarded and exposed to acid rain or left in a severe environment.

The lead content in the piezoelectric material 1 can be determined as a lead content relative to the total weight of the piezoelectric material 1 determined by X-ray fluorescence analysis (XRF), ICP atomic emission analysis, or the like.

The piezoelectric material 1 may be a piezoelectric ceramic containing barium titanate as a main component. Among lead-free piezoelectric ceramics, a piezoelectric ceramic containing barium titanate as a main component has a high absolute value of the piezoelectric constant d. Accordingly, a voltage required to obtain the same amount of strain can be reduced. Accordingly, the piezoelectric material 1 is preferably a piezoelectric ceramic that contains barium titanate as a main component from the environmental point of view also.

In this description, a "ceramic" refers to an aggregate (also referred to as a bulk) of crystal grains that is consolidated by a heat treatment and contains a metal oxide as a basic component, and is thus a polycrystal. A "ceramic" may also refer to a ceramic that has been processed after sintering.

The piezoelectric material may contain a perovskite-type metal oxide represented by general formula (1) below as a main component:

$$(Ba_{1-x}Ca_x)(Ti_{1-y}Zr_y)O_3 \ (0.02 \leq x \leq 0.30, \ 0.020 \leq y \leq 0.095, \ \text{and} \ y \leq x) \quad (1)$$

A piezoelectric material containing barium titanate as a main component has a phase transition temperature (Tr) at which a transition from a ferroelectric crystal phase to another ferroelectric crystal phase occurs.

Here, a "ferroelectric crystal phase" refers to a material that belongs to any of six crystal systems, namely, triclinic, monoclinic, orthorhombic, hexagonal, trigonal or rhombohedral, and tetragonal crystal systems, among seven crystal systems called crystal lattices.

The phase transition temperature Tr can be determined by measuring the dielectric constant of the piezoelectric element 20 while varying the measurement temperature using micro AC electric fields and determining the temperature at which the dielectric constant is maximal, for example. Alternatively, the phase transition temperature Tr can be determined from the temperature at which the crystal phase of the piezoelectric material 1 or the piezoelectric element 20 changes while varying the measurement temperature using X-ray diffraction or Raman spectroscopy. In general, the phase transition temperature from a first ferroelectric crystal phase to a second ferroelectric crystal phase (phase transition temperature in descending temperature) of a ferroelectric material slightly differs from the phase transition temperature from the second ferroelectric crystal phase to the first ferroelectric crystal phase (phase transition temperature in ascending temperature). In this description, the phase transition temperature Tr is a temperature at which the phase transition from the first ferroelectric crystal phase to the second ferroelectric crystal phase occurs, i.e., the phase transition temperature in descending temperature.

In general, the piezoelectric constant increases significantly, reaching its maximal at the phase transition temperature Tr. Accordingly, the change in piezoelectric constant with temperature is large near the phase transition temperature Tr and thus the amount of strain relative to the same input voltage changes. When such a piezoelectric material 1 is used in the piezoelectric element 20 to stabilize the amount of strain with changes in temperature, the piezoelectric element 20 can exhibit stable oscillation performance against temperature changes.

The phase transition temperature Tr preferably does not lie in a range of 0° C. or more and 35° C. or less and more preferably does not lie in a range of −5° C. or more and 50° C. or less. When the phase transition temperature Tr is outside the range of 0° C. or more and 35° C. or less, the change in amount of strain relative to the same input voltage can be expected to be suppressed to 20% or less against, for example, a change of 5° C. in temperature. When the phase transition temperature Tr does not lie in the range of −5° C. or more and 50° C. or less, the change in amount of strain relative to the same input voltage can be suppressed to 10% or less against, for example, a change of 5° C. in temperature.

In this description, a perovskite-type metal oxide refers to a metal oxide having a perovskite-type structure which is ideally a cubic crystal structure as described in Iwanami Rikagaku Jiten, 5th edition (published Feb. 20, 1998 by Iwanami Shoten Publishers). A metal oxide having a perovskite-type structure is usually expressed by a chemical formula, $ABO_3$. Element A and element B in a perovskite-type metal oxide take form of ions and occupy particular positions in a unit cell called A sites and B sites, respectively. For example, in a unit cell of a cubic crystal system, element A occupies vertexes of the cube and element B occupies the body-centered position of the cube. Element O is oxygen in the form of an anion and occupies face-centered positions of the cube.

In the metal oxide represented by general formula (1) above, barium (Ba) and calcium (Ca) are metal elements that occupy A sites and titanium (Ti) and zirconium (Zr) are metal elements that occupy B sites. Note that some of the Ba and Ca atoms may occupy B sites and/or some of the Ti and Zr atoms may occupy A sites.

In general formula (1), the molar ratio of the B-site element to O is 1:3. A metal oxide having a B/O ratio slightly deviated therefrom, e.g., 1.00:2.94 to 1.00:3.06, is still included in the scope of the present invention as long as the metal oxide has a perovskite structure as a main phase.

Structural analysis through X-ray diffraction or electron beam diffraction can be used to determine whether a metal oxide has a perovskite-type structure, for example.

In general formula (1), x represents the molar ratio of Ca in A sites and is in a range of $0.02 \leq x \leq 0.30$. When x is less than 0.02, the dielectric loss (tan δ) increases. When the dielectric loss is increased, the amount of heat generated when a voltage is applied to the piezoelectric element 20 to drive the piezoelectric element increases and the operation efficiency may be degraded. When x is greater than 0.30, the piezoelectric property may not be sufficient.

In general formula (1), y represents the molar ratio of Zr in B sites and is in a range of $0.020 \leq y \leq 0.095$. When y is less than 0.020, the piezoelectric property may not be sufficient. When y is greater than 0.095, the Curie temperature ($T_c$) becomes less than 85° C. and the piezoelectric property will be lost at high temperature.

In this description, a Curie temperature refers to a temperature at which ferroelectricity is lost. Examples of the method for detecting the temperature include a method of directly measuring the temperature at which ferroelectricity is lost by varying the measurement temperature and a method of measuring the dielectric constant using minute AC fields while varying the measurement temperature and determining the temperature at which the dielectric constant is maximal.

In general formula (1), the Ca molar ratio x and the Zr molar ratio y satisfy $y \leq x$. When $y > x$, the dielectric loss may increase and the insulating property may be insufficient. When all of the ranges concerning x and y described heretofore are satisfied simultaneously, the phase transition temperature Tr can be shifted from near room temperature to a temperature below the operating temperature range and thus the piezoelectric element 20 can be stably operated in a wide temperature range.

The ratio A/B of the molar amount of Ba and Ca in A sites to the molar amount of Ti and Zr in B sites may be in the range of $1.00 \leq A/B \leq 1.01$. When A/B is smaller than 1.00, abnormal grain growth readily occurs and the mechanical strength of the piezoelectric material 1 is degraded. In contrast, when A/B is larger than 1.01, the temperature needed for grain growth becomes excessively high and thus a sufficient density may not be obtained by a typical firing furnace and many pores and defects may occur in the piezoelectric material 1.

The technique for determining the composition of the piezoelectric material 1 is not particularly limited. Examples of the technique include X-ray fluorescence analysis, inductively coupled plasma (ICP) atomic emission spectroscopy, and atomic absorption spectrometry. The weight ratios and compositional ratios of the elements contained in the piezoelectric material 1 can be determined by any of these techniques.

The piezoelectric material 1 contains a perovskite-type metal oxide represented by general formula (1) as a main component and manganese (Mn) incorporated in the metal oxide. The Mn content may be 0.02 parts by weight or more and 0.40 parts by weight or less on a metal basis relative to 100 parts by weight of the metal oxide.

When the Mn content is within the above-described range, the insulating property and the mechanical quality factor Qm are improved. Here, the mechanical quality factor refers to a factor that indicates an elastic loss caused by oscillation when the piezoelectric material is used in an oscillator. The magnitude of the mechanical quality factor is observed as a sharpness of a resonance curve in impedance measurement. In other words, the mechanical quality factor is a factor that indicates the sharpness of the resonance of an oscillator. When the mechanical quality factor Qm is high, the amount of strain of the piezoelectric element near the resonance frequency is further increased and the piezoelectric element can be efficiently oscillated. Presumably, the insulating property and the mechanical quality factor are improved by introduction of defective dipoles due to Mn having a valence different from that of Ti and Zr and generation of internal electric fields resulting therefrom. When an internal electric field is present, the long-term reliability of the piezoelectric element 20 operated by applying voltage can be ensured.

The term "on a metal basis" with reference to the Mn content refers to a value determined by first determining the oxide-based amounts of elements constituting the metal oxide represented by general formula (1) based on the Ba, Ca, Ti, Zr, and Mn contents measured by XRF, ICP atomic emission spectroscopy, atomic absorption spectroscopy, or the like and then calculating the ratio of the weight of Mn relative to 100 parts by weight of the total amount of the elements constituting the metal oxide on a weight basis.

When the Mn content is less than 0.02 parts by weight, the effect of the polarization treatment is not sufficient to drive the piezoelectric element 20 is not sufficient. When the Mn content is greater than 0.40 parts by weight, the piezoelectric property is not sufficient and crystals having a hexagonal structure not contributing to the piezoelectric property emerge.

Manganese is not limited to metallic Mn and may take any form as long as manganese is contained as a component in the piezoelectric material. For example, manganese may be dissolved in B sites or may be included in grain boundaries. Manganese may take the form of a metal, ion, oxide, metal salt, or complex in the piezoelectric material. Preferably, manganese is dissolved in B sites from the viewpoints of insulating property and sinterability. When manganese is dissolved in B sites, a preferable range of the molar ratio A/B is $0.993 \leq A/B \leq 0.998$, where A is the molar amount of Ba and Ca in A sites and B is the molar amount of Ti, Zr, and Mn in B sites. A piezoelectric element 20 having an A/B within this range expands and contracts significantly in the length direction of the piezoelectric element 20 to create vibrations and has a high mechanical quality factor. Thus, a piezoelectric element 20 having high oscillation performance and high durability can be obtained.

The piezoelectric material 1 of the piezoelectric element may contain components (hereinafter referred to as auxiliary components) other than the compound represented by general formula (1) and Mn as long as the properties are not changed. The total content of the auxiliary components may be 1.2 parts by weight or less relative to 100 parts by weight of the metal oxide represented by general formula (1). When the auxiliary component content exceeds 1.2 parts by weight, the piezoelectric property and the insulating property of the piezoelectric material may be degraded. The content of the metal elements other than Ba, Ca, Ti, Zr, and Mn among the auxiliary components is preferably 1.0 parts by weight or less on an oxide basis or 0.9 parts by weight or less on a metal basis relative to the piezoelectric material 1. In this description, "metal elements" include semimetal elements such as Si, Ge, and Sb. When the content of the metal elements other than Ba, Ca, Ti, Zr, and Mn among the auxiliary components exceeds 1.0 parts by weight on an oxide basis or 0.9 parts by weight on a metal basis relative to the piezoelectric material 1, the piezoelectric property and the insulating property of the piezoelectric material 1 may be significantly degraded. The total content of Li, Na, Mg, and Al among the auxiliary components may be 0.5 parts by weight or less on a metal basis relative to the piezoelectric material 1. When the total content of Li, Na, Mg, and Al among the auxiliary components exceeds 0.5 parts by weight on a metal basis relative to the piezoelectric material, insufficient sintering may occur. The total of Y and V among the auxiliary components may be 0.2 parts by weight or less on a metal basis relative to the piezoelectric material. When the total content of Y and V exceeds 0.2 parts by weight on a metal basis relative to the piezoelectric material, the polarization treatment may become difficult.

Examples of the auxiliary components include sintering aids such as Si and Cu. Commercially available Ba and Ca raw materials contain Sr and Mg as unavoidable impurities and thus the piezoelectric material may contain impurity amounts of Sr and Mg. Similarly, a commercially available Ti raw material contains Nb as an unavoidable impurity and a commercially available Zr raw material contains Hf as an unavoidable impurity. Thus, the piezoelectric material 1 may contain impurity amounts of Nb and Hf.

The technique for measuring the weights of the auxiliary components is not particularly limited. Examples of the technique include X-ray fluorescence analysis (XRF), ICP atomic emission spectroscopy, and atomic absorption spectrometry.

A stator for an oscillatory wave motor according to an embodiment of the invention will now be described. The stator includes the above-described piezoelectric element that includes the common electrode on the first surface, and the drive phase electrode and the detection phase electrode on the second surface; a diaphragm disposed on the first surface of the piezoelectric element; and a power input/output wire disposed on the second surface of the piezoelectric element.

Figure 3A:
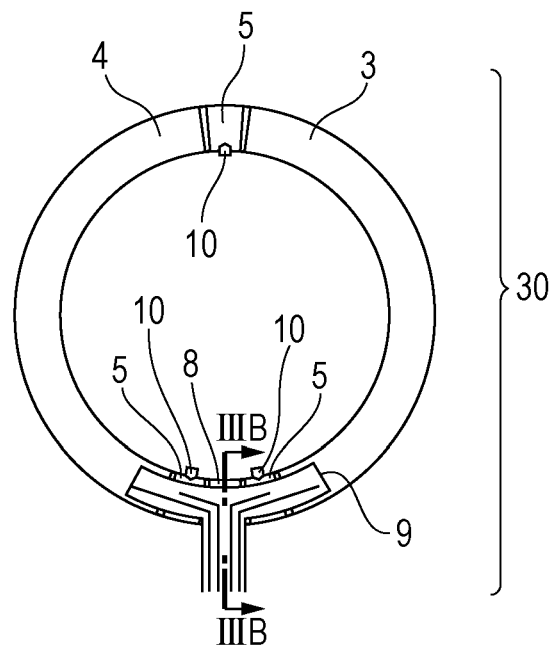
FIGS. 3A and 3B are schematic views showing a stator for an oscillatory wave motor according to an embodiment of the invention.
Figure 3B:
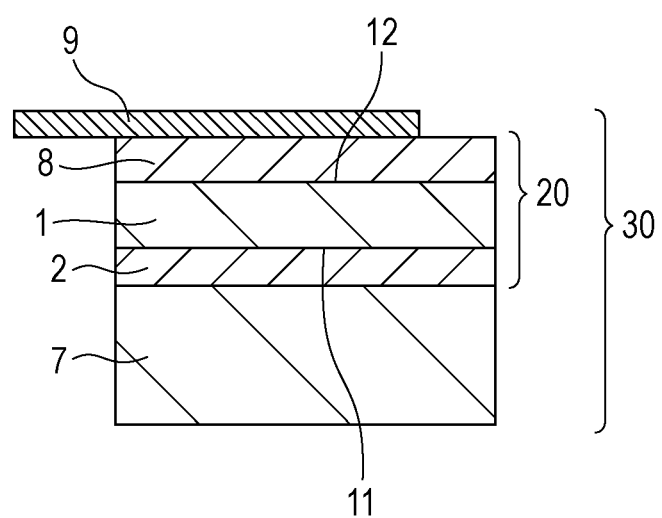

FIGS. 3A and 3B are schematic views showing a structure of a stator for an oscillatory wave motor. FIG. 3A is a schematic plan view of the stator and FIG. 3B is a cross-sectional view of the stator taken along line IIIB-IIIB in FIG. 3A.

As shown in FIG. 3B, a stator 30 for an oscillatory wave motor includes the piezoelectric element 20 and a diaphragm 7 composed of an elastic material on the common electrode 2 on one surface of the piezoelectric element 20. A power input/output wire 9 is disposed on the other surface of the piezoelectric element 20.

As shown in FIG. 3A, the input/output wire 9 of the stator 30 is equipped with an electric wire for supplying power to the drive phase electrodes 3 and 4, an electric wire connected to the common electrode 2 via the non-drive phase electrode 5, and an electric wire for transmitting an electrical signal output from the detection phase electrode 8 and is connected to the respective electrode phases.

As shown in FIG. 3A, at least one of the non-drive phase electrodes 5 is electrically connected to the common electrode 2 and the diaphragm 7 via a short-circuiting wire 10. According to this configuration, when the input/output wire 9 equipped with a number of wires corresponding to the electrodes is attached from above by using an anisotropic conductive film, at least one of the wires can be electrically connected to the common electrode 2 via the non-drive phase electrode 5.

In this stator for an oscillatory wave motor, a standing wave vibration excited by application of AC voltage to the drive phase electrode 3 in the A phase is referred to as an A-phase standing wave and a standing wave vibration excited by application of AC voltage of the same frequency to the drive phase electrode 4 in the B phase is referred to as a B-phase standing wave. An A-phase standing wave and a B-phase standing wave having the same amplitude are generated simultaneously such that the phase difference in time is 90° so that a travelling oscillatory wave is excited as a result of combination of the two standing waves.

An oscillatory wave motor according to an embodiment of the invention will now be described. The oscillatory wave motor includes a stator.

Figure 4A:
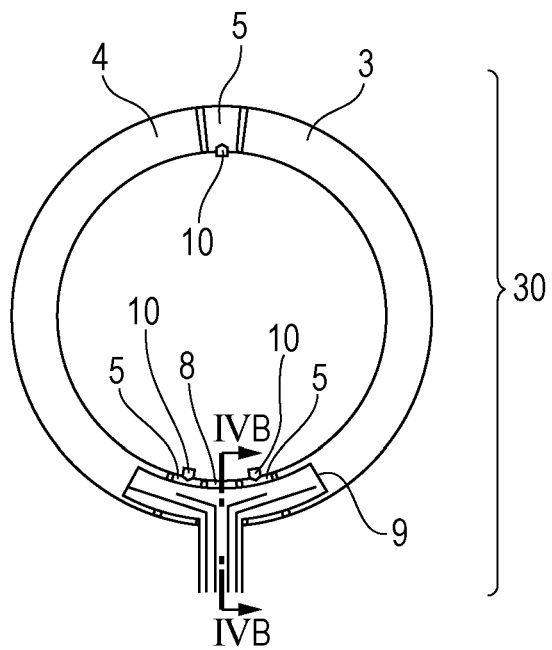
FIGS. 4A and 4B are schematic views showing an oscillatory wave motor according to an embodiment of the invention.
Figure 4B:
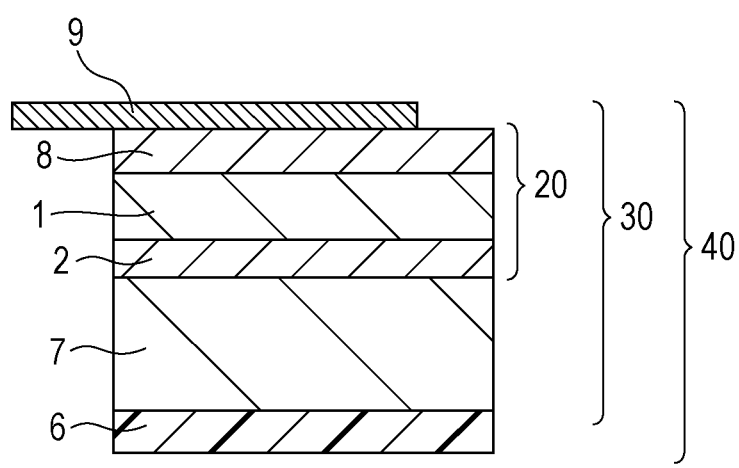

FIGS. 4A and 4B are schematic views showing a structure of an oscillatory wave motor. FIG. 4A is a schematic plan view of the oscillatory wave motor and FIG. 4B is a cross-sectional view of the oscillatory wave motor taken along line IVB-IVB in FIG. 4A.

Referring to FIG. 4B, an oscillatory wave motor 40 includes the stator 30 described above and a rotor 6 on the diaphragm 7. For example, a ring-shaped rotor 6 composed of an elastic material is caused to pressure-contact the surface of the diaphragm 7, which is a surface opposite to the input/output wire 9.

When a travelling wave is excited in the stator 30, points on a diaphragm 7 surface opposite to the piezoelectric element undergo a type of elliptic motion. The rotor thus receives a frictional force from the diaphragm 7 in the circumferential direction and is rotated. The rotation direction can be reversed by switching the sign of the phase difference of the AC voltage applied to the drive phase electrodes 3 and 4.

A driving control system according to an embodiment of the invention will now be described. The driving control system uses an oscillatory wave motor.

Figure 5:
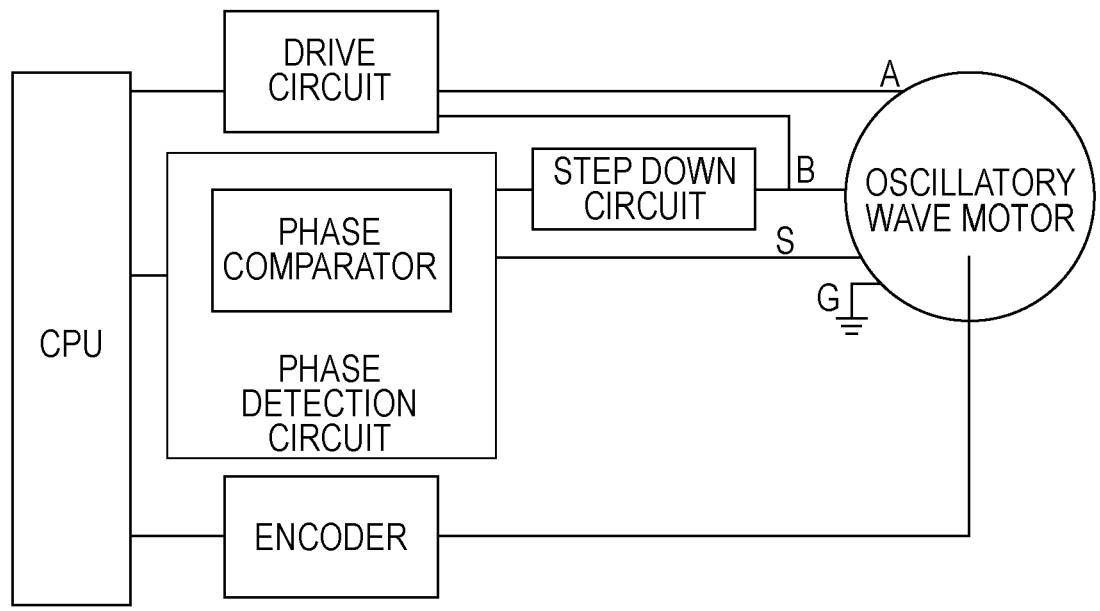
FIG. 5 is a schematic view of a circuit of a driving control system according to an embodiment of the invention.

FIG. 5 is a schematic diagram of a circuit showing a driving control system according to one embodiment of the invention and is a simplified control circuit diagram of a driving control system.

Referring to FIG. 5, an oscillatory wave motor is similar to the oscillatory wave motor shown in FIGS. 4A and 4B and includes an A-phase electrode of the piezoelectric element 20 of the oscillatory wave rotor, the A-phase electrode being denoted by A, a B-phase electrode denoted by B, a detection phase electrode denoted by S, and a common electrode 2 denoted by G These electrodes are electrically independently connected to the power input/output wire 9.

Referring to FIG. 5, an electrical signal output from a central processing unit (CPU) is input to the A phase and the B phase through a drive circuit while the voltage phase is being shifted by $\pi/2$. The electrical signal input to the B phase is simultaneously input to a phase detection circuit via a step-down circuit. When a travelling wave is excited in the oscillatory wave motor, the piezoelectric material in a portion sandwiched between the detection phase electrode and the common electrode vibrates and an electrical signal is output from the detection phase electrode. The output electrical signal is directly input to the phase detection circuit without passing through a step-down circuit. These two electrical signals are input to the phase comparator in the phase detection circuit and an electrical signal corresponding to the phase difference between the two electrical signals is output from the phase detection circuit to the CPU. During this process, an electrical signal output from an encoder for optically measuring the speed of rotation of the oscillatory wave motor is output to the CPU. According to this configuration, a step-down circuit between the detection phase electrode and the phase comparator which has been necessary in the related art can be omitted.

Based on the difference between the speed of rotation of the oscillatory wave motor and the speed of rotation designated by a drive command signal (not shown in the drawing) and the electrical signals output from the phase detection circuit, an electrical signal is again output from the CPU to the drive circuit on the basis of a preset logic to perform feedback control.

Next, an optical apparatus according to one embodiment of the invention is described. An optical apparatus includes the driving control system described above in a drive unit.

Figure 6A:
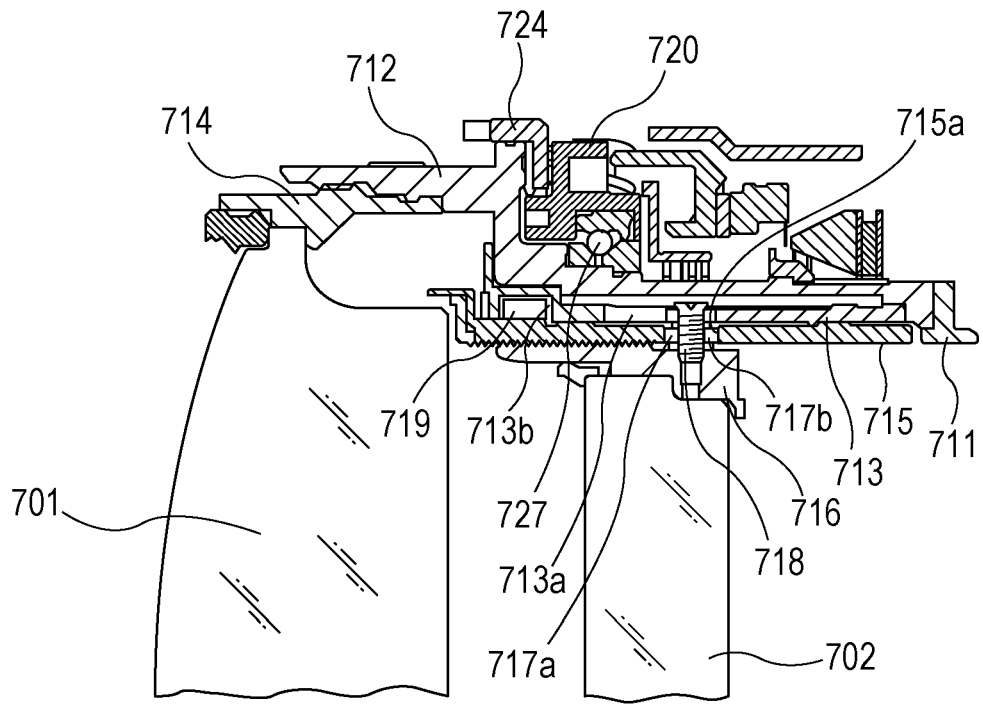
FIGS. 6A and 6B are schematic views of an optical apparatus according to an embodiment of the invention.
Figure 6B:
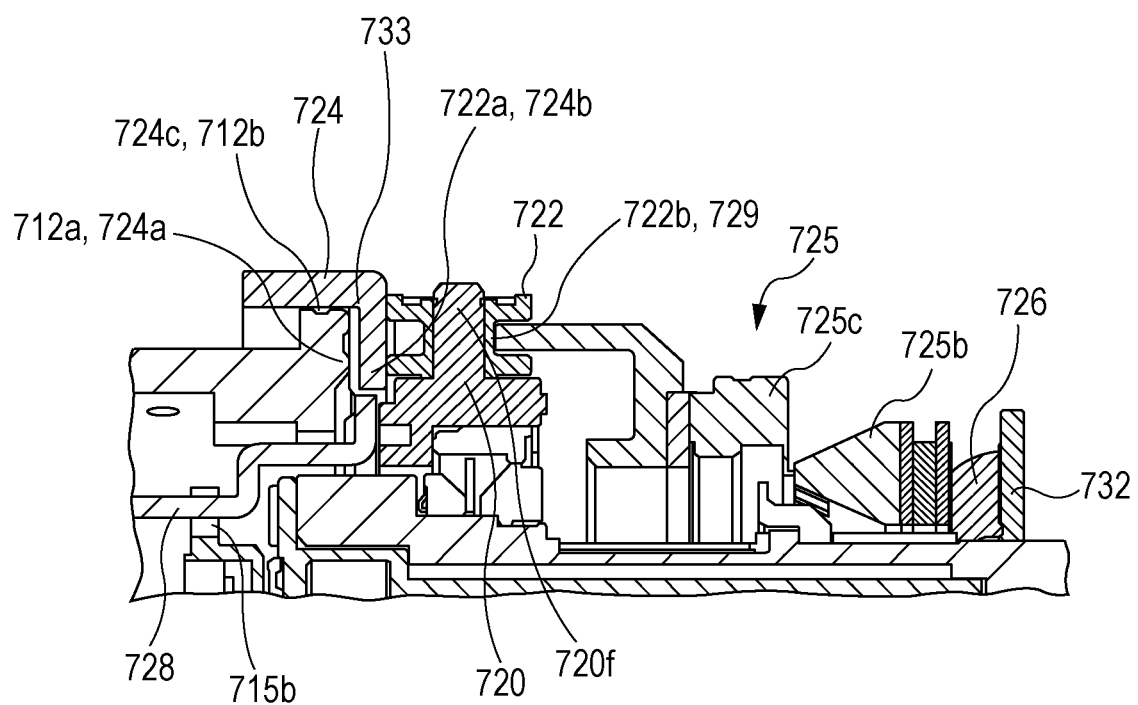
Figure 7:
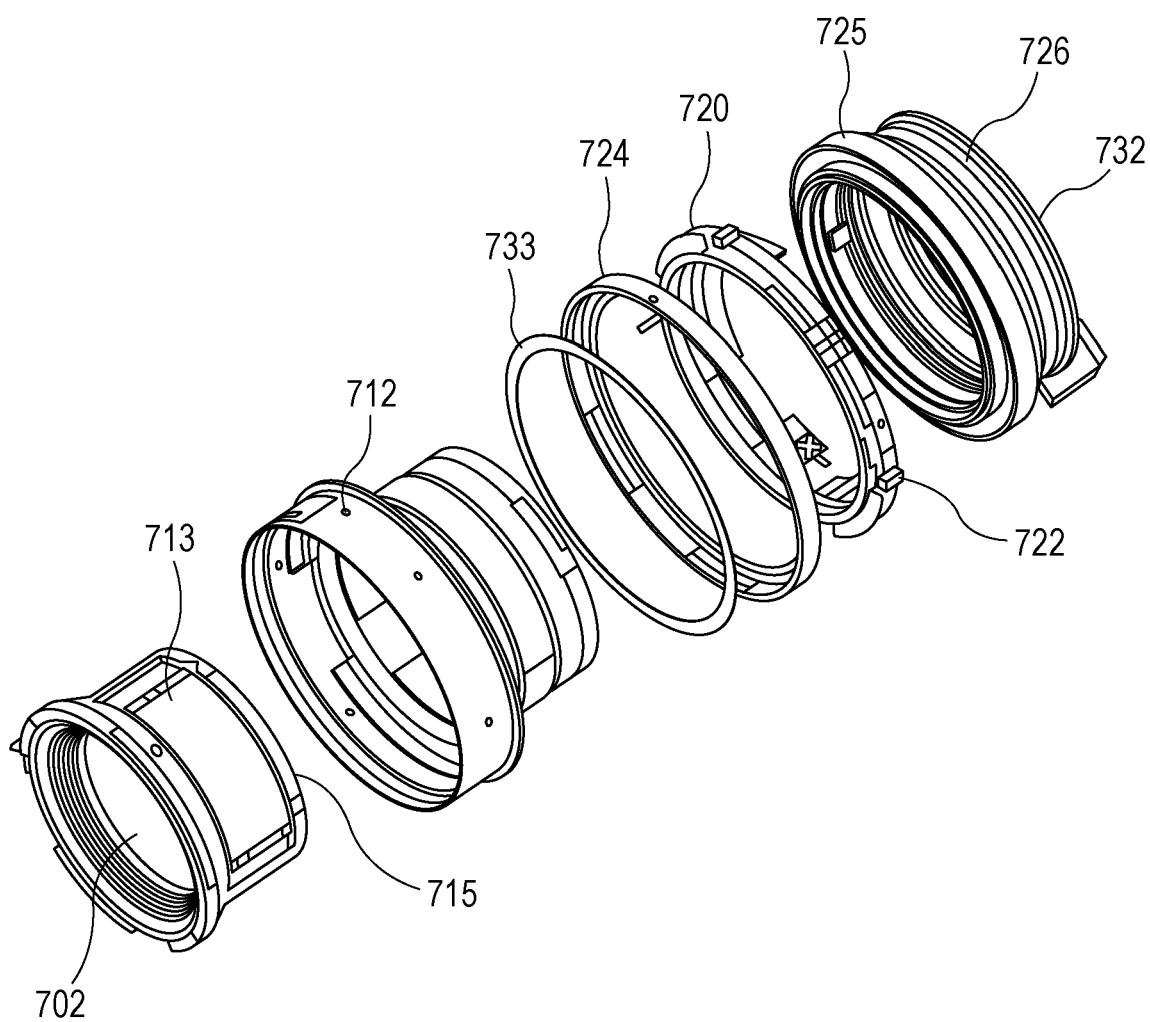
FIG. 7 is a schematic view of the optical apparatus.

FIGS. 6A and 6B are each a cross-sectional view of a related part of a replaceable lens barrel of a single-lens reflex camera, which is an example of an imaging apparatus according to an embodiment of the present invention. FIG. 7 is an exploded perspective view of the replaceable lens barrel.

Referring to FIGS. 6A, 6B, and 7, a fixed barrel 712 linear guide barrel 713, and a front lens group barrel 714 are fixed to a mount 711 detachable from and attachable to a camera. These are fixed members of the replaceable lens barrel.

A linear guide groove 713a extending in an optical axis direction is formed in the linear guide barrel 713 to guide a focus lens 702. A cam roller 717a and a cam roller 717b protruding in an outer radial direction are fixed with a shaft screw 718 to a rear lens group barrel 716 holding the focus lens 702. The cam roller 717a is fitted in the linear guide groove 713a.

A cam ring 715 is rotatably fitted to the inner periphery of the linear guide barrel 713. Relative movements between the linear guide barrel 713 and the cam ring 715 in the optical axis direction is inhibited since a roller 719 fixed to the cam ring 715 is fitted in an annular groove 713b of the linear guide barrel 713. A cam groove 715a for the focus lens 702 is formed in the cam ring 715. The cam roller 717b is fitted in the cam groove 715a.

A rotation transmitting ring 720 is provided on the outer peripheral side of the fixed barrel 712. The rotation transmitting ring 720 is held by a ball race 727 so that it can rotate at a particular position relative to the fixed barrel 712. A roller 722 is rotatably held by a shaft 720f extending in a radial manner from the rotation transmitting ring 720, and a large-diameter portion 722a of the roller 722 is in contact with a mount-side end surface 724b of a manual focus ring 724. A small-diameter portion 722b of the roller 722 is in contact with a joint member 729. Six equally spaced rollers 722 are arranged on the outer periphery of the rotation transmitting ring 720 and each roller is configured to have the above-described relationship.

A low-friction sheet (washer member) 733 is arranged on the inner radial portion of the manual focus ring 724. The low-friction sheet 733 is interposed between a mount-side end surface 712a of the fixed barrel 712 and a front-side end surface 724a of the manual focus ring 724. The outer radial surface of the low-friction sheet 733 has a ring shape and is fitted in an inner radial portion 724c of the manual focus ring 724. The inner radial portion 724c of the manual focus ring 724 is fitted in an outer radial portion 712b of the fixed barrel 712. The low-friction sheet 733 reduces the friction in a rotary ring mechanism in which the manual focus ring 724 is rotated relative to the fixed barrel 712 about the optical axis.

The large-diameter portion 722a of the roller 722 and a mount-side end surface 724b of the manual focus ring 724 contact each other under pressure by being pressed by a wave washer 726 that presses an oscillatory wave motor 725 toward the front side of the lens. The force from the wave washer 726 pressing the oscillatory wave motor 725 toward the front side of the lens also causes the small-diameter portion 722b of the roller 722 and the joint member 729 to contact each other under an adequate degree of pressure. The wave washer 726 is confined from moving in the mount direction by a washer 732 bayonet-mounted to the fixed barrel 712. The spring force (urging force) generated by the wave washer 726 is transmitted to the oscillatory wave motor 725 and to the roller 722 and serves as thrusting force of the manual focus ring 724 against the mount-side end surface 712a of the fixed barrel 712. In other words, the manual focus ring 724 is assembled while being urged against the mount-side end surface 712a of the fixed barrel 712 via the low-friction sheet 733.

Accordingly, when the oscillatory wave motor 725 is driven and rotated with respect to the fixed barrel 712 by a control CPU shown in FIG. 5, the roller 722 rotates about the center of the shaft 720f because the joint member 729 makes frictional contact with the small-diameter portion 722b of the roller 722. As the roller 722 rotates about the shaft 720f, the rotation transmitting ring 720 is rotated about the optical axis (automatic focusing operation).

When rotation force about the optical axis is applied to the manual focus ring 724 from a manual operation input unit not shown in the drawing, the roller 722 rotates about the shaft 720f since the mount-side end surface 724b of the manual focus ring 724 is in pressure-contact with the large-diameter portion 722a of the roller 722. As the large-diameter portion 722a of the roller 722 rotates about the shaft 720f, the rotation transmitting ring 720 is rotated about the optical axis. The oscillatory wave motor 725 at this time is prevented from rotating due to the frictional retention force of a rotor 725c and a diaphragm 725b (manual focusing operation).

Two focus keys 728 are installed in the rotation transmitting ring 720 at positions opposite to each other and fitted in notches 715b at the front tip of the cam ring 715. When automatic focusing operation or manual focusing operation is conducted and the rotation transmitting ring 720 is rotated about the optical axis, the rotation force is transmitted to the cam ring 715 via the focus keys 728. When the cam ring 715 is rotated about the optical axis, the rear lens group barrel 716 inhibited from rotating due to the cam roller 717a and the linear guide groove 713a moves back and forth along the cam groove 715a in the cam ring 715 by the cam roller 717b. This drives the focus lens 702 and focusing operation is conducted.

Although a replaceable lens barrel of a single-lens reflex camera has been described as an example of the optical apparatus of the present invention, the range of the optical apparatus is not limited to this. The optical apparatus may be any type of camera such as a compact camera, an electronic still camera, or the like. Any optical apparatus having an oscillatory wave motor or a driving control system in the drive unit is included in the scope of the invention.

A method for producing a stator for an oscillatory wave motor will now be described.

A method for producing a stator for an oscillatory wave motor include a step (A) of forming a common electrode on a first surface of a piezoelectric material, forming polarizing electrodes on a second surface of the piezoelectric material so as to sandwich the piezoelectric material between the common electrode and the polarizing electrodes, and then applying a voltage to the piezoelectric material so as polarize the piezoelectric material and obtain a piezoelectric element; and a step (B) of joining the polarizing electrodes to form at least a drive phase electrode, a detection phase electrode, and a non-drive phase electrode and bonding a power input/output wire onto a surface of the detection phase electrode or the non-drive phase electrode at a temperature equal to or higher than a depolarization temperature Td of the piezoelectric material.

FIGS. 8A to 8D are step diagrams showing an example of a method for producing a stator for an oscillatory wave motor.

First, a method for making a piezoelectric material used in the piezoelectric element is described.

To a raw material powder adjusted to have a desired composition, a dispersing agent, a binder, a plasticizer, and other additives if necessary, and water or an organic solvent are added, followed by mixing. The resulting mixture is press-formed under a pressure needed to form a high-density sintered body to prepare a compact. When the needed pressure is not achieved by press-forming alone, cold isostatic pressing (CIP) may be conducted to apply a required pressure. Alternatively, a compact ingot may be fabricated by CIP without conducting press-forming. Yet alternatively, a slurry may be applied to a support, such as a film, to a particular thickness by a technique such as a doctor blade technique or a die coating technique and dried to form a green sheet compact.

Next, the compact is fired to fabricate a piezoelectric material in the sintered ceramic form. The firing conditions may be adequately selected according to the desired piezoelectric material. The density may be as high as possible and grain growth that attains uniform size may be conducted. If needed, the compact may be processed into a desired shape before firing.

Next, a method for making a piezoelectric element is described. After forming a common electrode on a first surface of the piezoelectric material and polarizing electrodes on a second surface of the piezoelectric material so as to sandwich the piezoelectric material, a voltage is applied to polarize the piezoelectric material and obtain a piezoelectric element (step A).

Figure 8A:
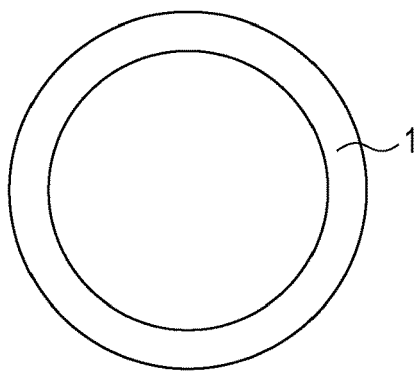
FIGS. 8A to 8D are process diagrams showing an example of a method for making a stator for an oscillatory wave motor according to an embodiment of the invention.
Figure 8B:
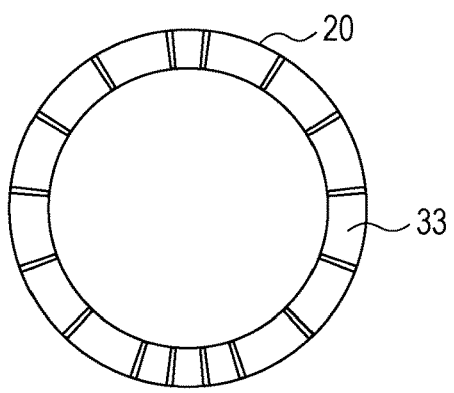

A sintered ceramic piezoelectric material prepared as described above is grinded into a desired size to fabricate a single piece of piezoelectric material 1 having a ring shape as shown in FIG. 8A. Then, as shown in FIG. 8B, polarizing electrodes 33 are formed on one of the surfaces of the piezoelectric material 1 and a common electrode 2 is formed over the entire opposite surface of the piezoelectric material 1 by baking a silver paste, Au sputtering, Au plating, or the like, so as to prepare a piezoelectric element 20.

The polarizing electrodes 33 may each be as wide as possible with respect to the surface of the piezoelectric material from the viewpoint of efficiency of exciting vibrations. The distances between the electrodes are as small as possible within a range that can prevent discharge between electrodes during polarization.

The method for making a stator for an oscillatory wave motor includes a step (A) of polarizing the piezoelectric element, and then a step (B) of joining polarizing electrodes to form at least a drive phase electrode, a detection phase electrode, and a non-drive phase electrode and bonding a power input/output wire onto a surface of the detection phase electrode or the non-drive phase electrode at a temperature equal to or higher than a depolarization temperature Td of the piezoelectric material.

First, the piezoelectric element 20 is polarized. The polarization treatment temperature may be equal to or less than the Curie temperature Tc or depolarization temperature Td. The treatment time may be 5 minutes to 10 hours. The treatment atmosphere may be air or a noncombustible oil such as silicone oil. An electric field of 0.5 to 5.0 kV/mm is applied as the treatment voltage.

Figure 8C:
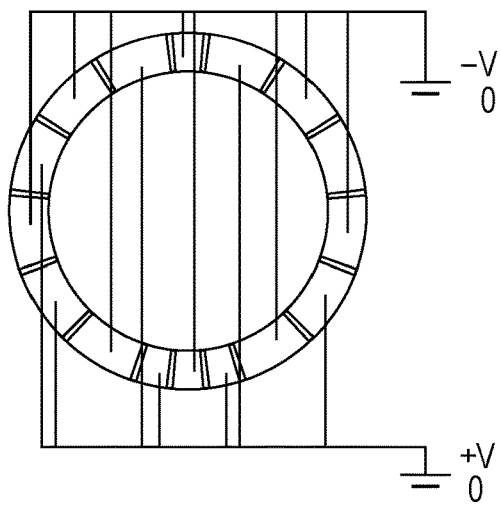

As shown in FIG. 8C, when polarization is performed by applying a particular electric field to the electrodes but with reversed directions of electric fields between adjacent electrodes, the polarity of expansion and contraction relative to a particular direction of the electric field becomes reversed every $\lambda/2$ pitch.

A depolarization temperature of a piezoelectric material is a temperature Td (° C.) up to which a polarized piezoelectric material after elapse of a sufficient time from the termination of the polarizing treatment is heated from room temperature so that the piezoelectric constant of the piezoelectric material after the heating and cooling to room temperature is smaller than, e.g., 95% or less of, the piezoelectric constant of the piezoelectric material before heating.

The Curie temperature is a temperature at which a phase transition to a centrosymmetrical crystal structure (having no piezoelectricity) occurs. For example, the Curie temperature Tc of a piezoelectric material can be indirectly measured by increasing the temperature in a thermostatic chamber and measuring the temperature Tc at which the dielectric constant is maximal.

In general, a polarization treatment changes the distribution of the inner stress and strain. Accordingly, unless the same temperature and the same electric field are applied to the non-drive phase electrode also, changes in strains and/or stress do not occur by polarization over the entire circumferential area having a ring shape, resulting in occurrence of deflection and distortion in the non-drive phase region and cracking, splitting, and bonding failures during bonding the diaphragm 7 to the piezoelectric element. Accordingly, as shown in FIG. 8C, the non-drive phase may also be subjected to the same polarization treatment.

The polarization treatment may be performed before bonding of the elastic member but can be performed after bonding.

Next, a ring-shaped elastic member having the same inner diameter and outer diameter as those of the piezoelectric material 1 is thermally press-bonded onto a common electrode 2-side surface of the polarized piezoelectric element 20 by using an epoxy adhesive or the like. The bonding temperature may be less than the Curie temperature or the depolarization temperature of the piezoelectric material 1. At a bonding temperature equal to or higher than Tc or Td of the piezoelectric material 1, the absolute value d(1) of the piezoelectric constant of the drive phase of the piezoelectric element 20 may be lowered.

Figure 8D:
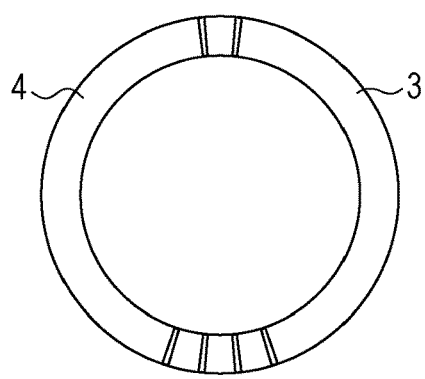

Next, as shown in FIG. 8D, among the polarizing electrodes, those that are adjacent and spaced from each other at $\lambda/2$ pitches are connected with a conductive paste or the like to make an A-phase electrode 3 and a B-phase electrode 4. The A-phase electrode 3 and the B-phase electrode 4 respectively function as drive phase electrodes 3 and 4. The detection phase electrode 8 may be selected from among the electrodes in the λ/4 and 3λ/4 regions that lie between the A-phase electrode 3 and the B-phase electrode 4. The rest of the electrodes function as the non-drive phase electrodes 5.

A stator for an oscillatory wave motor is obtained as a result of the above-described series of production steps. As shown in FIG. 3A, an input/output wire 9 is aligned with the stator for the oscillatory wave motor so that power can be input to the drive phase electrodes 3 and 4, the non-drive phase electrodes 5, and the detection phase electrode 8 of the piezoelectric material 1, and bonded to the piezoelectric material 1. A widely available flexible cable can be used as the input/output wire 9. Bonding can be performed with an epoxy adhesive but an anisotropic conductive paste (ACP) having electrical conductivity is preferably used to reduce the conduction failures. An anisotropic conductive film (ACF) is more preferable from the viewpoint of mass production since the process can be accelerated.

The bonding is performed at a temperature equal to or higher than the depolarization temperature Td of the piezoelectric material 1 to decrease the absolute value of the piezoelectric constant of the piezoelectric material 1 in the portion sandwiched between the detection phase electrode 8 and the common electrode 2. The absolute value d(2) of the piezoelectric constant of the piezoelectric material 1 in a portion sandwiched between the common electrode 2 and the detection phase electrode 8 becomes smaller than the absolute value d(1) of the piezoelectric constant of the piezoelectric material 1 in a portion sandwiched between the common electrode 2 and the drive phase electrodes 3 and 4.

Bonding is more preferably conducted at a temperature equal to or hither than the Curie temperature Tc so as to further decrease the absolute value of the piezoelectric constant of the piezoelectric material 1 in a portion sandwiched between the detection phase electrode 8 and the common electrode 2 or to make the piezoelectric constant zero.

During this process, the same bonding temperature is applied also to at least one of the non-drive phase electrodes 5 to decrease the absolute value of the piezoelectric constant of the piezoelectric material 1 in a portion sandwiched between the non-drive phase electrode 5 and the common electrode 2 or to make the piezoelectric constant zero. Accordingly, at least one of the non-drive phase electrodes 5 not electrically connected to the wires in the input/output wire 9 can be prevented from being affected by unneeded vibrations other than the vibrations excited from the A phase and the B phase during operation even when that at least one non-drive phase electrode is not electrically connected to the common electrode 2.

When the piezoelectric constant (absolute value) of the piezoelectric material 1 in the portion sandwiched between the detection phase electrode 8 and the common electrode 2 is decreased by the aforementioned process, the voltage value of the electrical signal output from the detection phase electrode 8 can be adjusted to a level equal to or less than the upper limit voltage value set in the phase comparator.

However, according to this method of decreasing the piezoelectric constant (absolute value), the piezoelectric constant may not always be decreased to a desired level or may be excessively decreased such that the magnitude of the electrical signal output from the detection phase is excessively low depending on the relationship between the depolarization temperature or Curie temperature Tc of the piezoelectric material 1 and the temperature needed to bond the input/output wire 9. Accordingly, in order to decrease the piezoelectric constant of the piezoelectric material 1 to a desired level in a portion sandwiched between the detection phase and the common electrode 2 by adjusting the bonding temperature Tf (e.g., 200° C.) of the input/output wire 9, the depolarization temperature of the piezoelectric material 1 may at least be equal to or less than Tf.

However, when the depolarization temperature Td of the piezoelectric material is significantly lower than the bonding temperature Tf of the input/output wire 9, e.g., Td=Tf−100, the temperature in part of the piezoelectric material in the A phase and the B phase rises due to the heat conduction during bonding of the input/output wire 9 and the piezoelectric constant decreases rapidly. Accordingly, the depolarization temperature Td of the piezoelectric material 1 is preferably Tf−100° C. or more and Tf or less and more preferably 100° C. or more and 200° C. or less.

After the step (B), a step (C) of polarizing the piezoelectric material in a portion sandwiched between the detection phase electrode and the common electrode may be performed. The piezoelectric constant of the piezoelectric material in the detection phase portion of the piezoelectric material 1 can be adjusted by conducting a polarization treatment after the step (B).

The temperature at which the polarization treatment is conducted may be set within a range that does not cause separation of the adhesive bonded to the elastic member bonding portion or the input/output wire 9 bonding portion. For example, the polarization treatment is preferably performed at 60° C. or less and more preferably at room temperature (25° C.) so that the polarization can be carried out without substantially affecting the adhesive.

The electric field applied in performing the re-polarization treatment may be set within a range that does not cause discharging between wires such as those in the input/output wire 9.

The step of conducting the polarization treatment, the step of bonding a vibrating member, the step of shorting between the electrodes, and a step of bonding the input/output wire described above need not be performed in the order described above. The order may be any as long as the piezoelectric constant (absolute value) of the piezoelectric material 1 in the region sandwiched between the detection phase electrode 8 and the common electrode 2 is smaller than the piezoelectric constant (absolute value) of the piezoelectric material 1 in the portion sandwiched between the common electrode 2 and the drive phase electrodes 3 and 4. In this regard, only the order of the steps (A), (B), and (C) is to remain unchanged.

Lastly, the input/output wire 9 is connected to a drive control circuit including a phase comparator so as to fabricate the driving control system for an oscillatory wave motor.

EXAMPLES

Next, the oscillatory wave motor according is described by using Examples which do not limit the scope of the invention. Examples are described below with reference to the drawings and by using reference characters in the drawings.

Example 1

First, a method for preparing a piezoelectric material is described.

Raw materials, $K_2CO_3$, $Na_2CO_3$, $Nb_2O_5$, and $Ta_2O_5$ were mixed so that a perovskite-type sintered compact $(K,Na)(Nb,Ta)O_3$ having a desired composition ratio was to be obtained and granulated together with a binder and a dispersing agent in a spray dryer to obtain a granulated powder. The granulated powder was charged in a disk-shaped mold and uniaxially formed under a pressure of 200 MPa into a compact. Then the compact was fired in an electric furnace in an air atmosphere at 1300° C. for 5 hours. The heating rate was 2.5° C./min and during heating, 600° C. was retained for 3 hours. As a result, a piezoelectric material was obtained.

The resulting sintered piezoelectric material was grinded into a ring shape having a substantially uniform thickness of 0.5 mm A silver paste was applied to both surfaces of the ring by screen-printing so as to form a common electrode and polarizing electrodes by patterning. The interelectrode distance between the adjacent polarizing electrodes was 0.5 mm.

The ring-shaped piezoelectric material was polarized in air using a DC power supply so that a 1 kV/mm electric field was applied. The atmosphere temperature was 100° C., the applied field was 1 kV/mm, and the voltage application time was 180 minutes.

A rectangular prism having an aspect ratio of 10×2.5×0.5 was cut out at a position corresponding to a polarizing electrode 33 of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 200° C. Another rectangular prism piezoelectric material was placed in a thermostatic chamber and the depolarization temperature Td was measured by a resonance-antiresonance method while increasing and decreasing the temperature. As a result, Td was found to be 180° C.

As shown in FIGS. 4A and 4B, an input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20. All of the non-drive phase electrodes 5 are connected through a short-circuiting wire 10 so that they are all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.4 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.5 times the piezoelectric constant of the drive phase electrode portion.

Example 2

In Example 2, a perovskite-type piezoelectric material 1 represented by (Bi,Na,K)TiO$_3$—BaTiO$_3$ was prepared and an oscillatory wave motor control system was made bas in Example 1 but with this perovskite-type piezoelectric material 1. The raw materials used were Bi$_2$O$_3$, Na$_2$CO$_3$, K$_2$CO$_3$, BaCO$_3$, and TiO$_2$. Firing was conducted in an air atmosphere at 1150° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 180° C. Another rectangular prism piezoelectric material 1 was placed in a thermostatic chamber and the depolarization temperature Td was measured by a resonance-antiresonance method while increasing and decreasing the temperature. As a result, Td was found to be 150° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20. All of the non-drive phase electrodes 5 were shorted through a short-circuiting wire so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.1 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.5 times the piezoelectric constant of the drive phase electrode portion.

Example 3

In Example 3, an oscillatory wave motor control system was prepared as in Example 2. The raw materials used were Bi$_2$O$_3$, Na$_2$CO$_3$, K$_2$CO$_3$, BaCO$_3$, and TiO$_2$. Firing was conducted in an air atmosphere at 1150° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 180° C. Another rectangular prism piezoelectric material 1 was placed in a thermostatic chamber and the depolarization temperature Td was measured by a resonance-antiresonance method while increasing and decreasing the temperature. As a result, Td was found to be 150° C.

An input/output wire 9 was press-bonded to the ring-shaped piezoelectric material 1 by using an anisotropic conductive film (ACF) at 200° C. A heater at 200° C. was also brought into contact with the non-drive phase in a region between the A phase and the B phase spaced from each other by λ/4.

Then an A-phase electrode 3 and a B-phase electrode 4 were formed with an electrode paste by screen-printing. As a result, a piezoelectric element 20 was obtained.

The non-drive phase electrodes 5 located on the both sides of the detection phase were shorted with a short-circuiting wire 10 so that they were both electrically connected to the common electrode 2 and the diaphragm 7. However, a non-drive phase electrode 5 in a portion between the A phase and the B phase spaced from each other by λ/2 was electrically independent from the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.1 times the input voltage or less.

A rectangular prism having an aspect ratio of 10×2.5×0.5 was cut out from each of a drive phase electrode position and a detection phase electrode position of the ring-shaped piezoelectric material and from a non-drive phase electrode in a portion of the piezoelectric material between the A phase and the B phase spaced from each other by λ/2. The piezoelectric constant was determined by a resonance-antiresonance method. As a result, the piezoelectric constant in the detection phase electrode portion was 0.5 times the piezoelectric constant of the drive phase electrode portion. The piezoelectric constant of the piezoelectric material 1 in a portion sandwiched between the non-drive phase electrode 5 and the common electrode 2 was 0.5 times the piezoelectric constant of the drive phase electrode portion.

Example 4

In Example 4, a piezoelectric material 1 containing 0.12 parts by weight of manganese in a composition represented by $BaTiO_3$ was prepared and an oscillatory wave motor control system was constructed as in Example 1 except for this piezoelectric material 1. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer. Firing was conducted in an air atmosphere at 1300° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 130° C. Another rectangular prism piezoelectric material 1 was placed in a thermostatic chamber and the depolarization temperature Td was measured by a resonance-antiresonance method while increasing and decreasing the temperature. As a result, Td was found to be 100° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

All of the non-drive phase electrodes 5 were shorted through a short-circuiting wire so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.001 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.001 times the piezoelectric constant of the drive phase electrode portion.

Example 5

In Example 5, a piezoelectric material 1 containing 0.12 parts by weight of manganese in a composition represented by $BaTiO_3$ was prepared and an oscillatory wave motor control system was constructed as in Example 4 except for this piezoelectric material 1. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer.

Firing was conducted in an air atmosphere at 1300° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 130° C. Another rectangular prism piezoelectric material 1 was placed in a thermostatic chamber and the depolarization temperature Td was measured by a resonance-antiresonance method while increasing and decreasing the temperature. As a result, Td was found to be 100° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

This piezoelectric element was placed in a thermostatic chamber having an atmosphere temperature of 60° C. and a 0.5 kV/mm electric field was applied to the piezoelectric material 1 in a portion sandwiched between the detection phase electrode 8 and the common electrode 2 for 180 minutes to polarize the detection phase for the second time.

All of the non-drive phase electrodes 5 were shorted with, for example, conductive paste so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.05 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.07 times the piezoelectric constant of the drive phase electrode portion.

Example 6

In Example 6, a piezoelectric material containing 0.12 parts by weight of manganese in a composition represented by $BaTiO_3$ was prepared and an oscillatory wave motor control system was constructed as in Example 4. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer.

Firing was conducted in an air atmosphere at 1300° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 130° C. Another rectangular prism piezoelectric material 1 was placed in a thermostatic chamber and the depolarization temperature Td was measured by a resonance-antiresonance method while increasing and decreasing the temperature. As a result, Td was found to be 100° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

This piezoelectric element was placed in a thermostatic chamber having an atmosphere temperature of 60° C. and a 1.0 kV/mm electric field was applied to the piezoelectric material 1 in a portion sandwiched between the detection phase electrode 8 and the common electrode 2 for 180 minutes to polarize the detection phase for the second time.

All of the non-drive phase electrodes 5 were shorted with a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.1 times the input voltage or less.

A rectangular prism having an aspect ratio of 10×2.5×0.5 was cut out from each of a drive phase electrode position and a detection phase electrode position of the piezoelectric material and the piezoelectric constant was determined by a resonance-antiresonance method. As a result, the piezoelectric constant in the detection phase electrode portion was 0.2 times the piezoelectric constant of the drive phase electrode portion.

Example 7

In Example 7, a piezoelectric material 1 containing 0.12 parts by weight of manganese in a composition represented by $BaTiO_3$ was prepared and an oscillatory wave motor control system was constructed as in Example 4. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer.

Firing was conducted in an air atmosphere at 1300° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 130° C. Another rectangular prism piezoelectric material 1 was placed in a thermostatic chamber and the depolarization temperature Td was measured by a resonance-antiresonance method while increasing and decreasing the temperature. As a result, Td was found to be 100° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

A 0.5 kV/mm electric field was applied to the piezoelectric material 1 of the piezoelectric element in a portion sandwiched between the detection phase electrode 8 and the common electrode 2 at room temperature (25° C.) for 180 minutes to polarize the detection phase for the second time.

All of the non-drive phase electrodes 5 were shorted with a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.01 times the input voltage or less.

A rectangular prism having an aspect ratio of 10×2.5×0.5 was cut out from each of a drive phase electrode position and a detection phase electrode position of the piezoelectric material and the piezoelectric constant was determined by a resonance-antiresonance method. As a result, the piezoelectric constant in the detection phase electrode portion was 0.03 times the piezoelectric constant of the drive phase electrode portion.

Example 8

In Example 8, a piezoelectric material 1 containing 0.12 parts by weight of manganese in a composition represented by $BaTiO_3$ was prepared and an oscillatory wave motor control system was constructed as in Example 4. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer.

Firing was conducted in an air atmosphere at 1300° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 130° C. Another rectangular prism piezoelectric material 1 was placed in a thermostatic chamber and the depolarization temperature Td was measured by a resonance-antiresonance method while increasing and decreasing the temperature. As a result, Td was found to be 100° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

A 1.0 kV/mm electric field was applied to the piezoelectric material 1 of the piezoelectric element in a portion sandwiched between the detection phase electrode 8 and the common electrode 2 at room temperature (25° C.) for 180 minutes to polarize the detection phase for the second time.

All of the non-drive phase electrodes 5 were shorted with a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.08 times the input voltage or less.

A rectangular prism having an aspect ratio of 10×2.5×0.5 was cut out from each of a drive phase electrode position and a detection phase electrode position of the piezoelectric material and the piezoelectric constant was determined by a resonance-antiresonance method. As a result, the piezoelectric constant in the detection phase electrode portion was 0.1 times the piezoelectric constant of the drive phase electrode portion.

Example 9

In Example 9, a piezoelectric material 1 containing 0.12 parts by weight of manganese in a composition represented by $BaTiO_3$ was prepared and an oscillatory wave motor control system was constructed as in Example 7. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer.

Firing was conducted in an air atmosphere at 1300° C. for 5 hours. The heating rate was 2.5° C./min, a temperature of 600° C. was retained for 3 hours during heating, and a piezoelectric material 1 was obtained as a result.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 130° C. Another rectangular prism piezoelectric material 1 was placed in a thermostatic chamber and the depolarization temperature Td was measured by a resonance-antiresonance method while increasing and decreasing the temperature. As a result, Td was found to be 100° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20. A heater at 200° C. was brought into direct contact with a non-drive phase in a region between the A phase and the B phase spaced from each other by $\lambda/4$.

A 1.0 kV/mm electric field was applied to the piezoelectric material 1 of the piezoelectric element 20 in a portion sandwiched between the detection phase electrode 8 and the common electrode 2 at room temperature (25° C.) for 180 minutes to polarize the detection phase for the second time.

The non-drive phase electrodes 5 on the both sides of the detection phase were shorted with a short-circuiting wire 10 so that both the non-drive phase electrodes 5 were electrically connected to the common electrode 2 and the diaphragm 7. However, a non-drive phase electrode 5 in a portion between the A phase and the B phase spaced from each other by $\lambda/2$ was electrically independent from the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.03 times the input voltage or less.

A rectangular prism having an aspect ratio of 10×2.5×0.5 was cut out from each of a drive phase electrode position and a detection phase electrode position of the piezoelectric material and from a non-drive phase of the piezoelectric material between the A phase and the B phase spaced from each other by $\lambda/2$. The piezoelectric constant was determined by a resonance-antiresonance method. As a result, the piezoelectric constant in the detection phase electrode portion was 0.05 times the piezoelectric constant of the drive phase electrode portion. The piezoelectric constant of the piezoelectric material 1 in a portion sandwiched between the non-drive phase electrode 5 and the common electrode 2 was 0.02 times the piezoelectric constant of the drive phase electrode portion.

Example 10

In Example 10, a piezoelectric material 1 containing 0.18 parts by weight of manganese in a composition represented by $(Ba_{0.860}Ca_{0.140})(Ti_{0.94}Zr_{0.06})O_3$ was prepared and an oscillatory wave motor control system was constructed as in Example 1 except for this piezoelectric material. Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed such that the molar ratio was 86.0:8.0:6.0.

The weighed powders were dry-mixed in a ball mill for 24 hours. To the resulting mixed powder, 0.18 parts by weight of manganese(II) acetate on a manganese metal basis and 3 parts by weight of a PVA binder relative to the mixed powder were caused to adhere on surfaces of the mixed powder by using a spray dryer in order to granulate the mixed powder.

The granulated powder was filled in a mold and pressed under 200 MPa of forming pressure with a press-molding machine to prepare a disk-shaped compact. The compact may be further pressed by using a cold isostatic press-molding machine.

The compact was placed in an electric furnace, and sintered in an air atmosphere for a total of 24 hours during which a maximum temperature of 1340° C. was retained for 5 hours.

The composition was analyzed by X-ray fluorescence analysis. The results found that 0.18 parts by weight of manganese was contained in the composition represented by $(Ba_{0.86}Ca_{0.14})(Ti_{0.94}Zr_{0.06})O_3$. This means that the composition prepared by weighing matches the composition after sintering. The contents of the elements other than Ba, Ca, Ti, Zr, and Mn were below detection limits, i.e., less than 1 part by weight.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 110° C. Another rectangular prism piezoelectric material 1 was placed in a thermostatic chamber and the depolarization temperature Td was measured by a resonance-antiresonance method while increasing and decreasing the temperature. As a result, Td was found to be 95° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

All of the non-drive phase electrodes 5 were shorted through a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.001 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.001 times the piezoelectric constant of the drive phase electrode portion.

Example 11

In Example 11, a piezoelectric material 1 containing 0.24 parts by weight of manganese in a composition represented by $(Ba_{0.813}Ca_{0.187})(Ti_{0.94}Zr_{0.06})O_3$ was prepared and an oscillatory wave motor control system was constructed as in Example 1 except for this piezoelectric material. Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed such that the molar ratio was 81.3:12.7:6.0.

The weighed powders were dry-mixed in a ball mill for 24 hours. To the resulting mixed powder, 0.24 parts by weight of manganese(II) acetate on a manganese metal basis and 3 parts by weight of a PVA binder relative to the mixed powder were caused to adhere on surfaces of the mixed powder by using a spray dryer in order to granulate the mixed powder.

The granulated powder was filled in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1340° C. was retained for 5 hours.

The composition was analyzed by X-ray fluorescence analysis. The results found that 0.24 parts by weight of manganese was contained in the composition represented by $(Ba_{0.813}Ca_{0.187})(Ti_{0.94}Zr_{0.06})O_3$. This means that the composition prepared by weighing matches the composition after sintering. The contents of the elements other than Ba, Ca, Ti, Zr, and Mn were below detection limits, i.e., less than 1 part by weight.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 105° C. Another rectangular prism piezoelectric material 1 was placed in a thermostatic chamber and the depolarization temperature Td was measured by a resonance-antiresonance method while increasing and decreasing the temperature. As a result, Td was found to be 90° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

All of the non-drive phase electrodes 5 were shorted through a short-circuiting wire so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.001 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.002 times the piezoelectric constant of the drive phase electrode portion.

Example 12

In Example 12, a piezoelectric material 1 containing 0.18 parts by weight of manganese in a composition represented by $(Ba_{0.860}Ca_{0.140}(Ti_{0.94}Zr_{0.06})O_3$ was prepared and an oscillatory wave motor control system was constructed as in Example 7 except for this piezoelectric material. Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed such that the molar ratio was 86.0:8.0:6.0.

The weighed powders were dry-mixed in a ball mill for 24 hours. To the resulting mixed powder, 0.24 parts by weight of manganese(II) acetate on a manganese metal basis and 3 parts by weight of a PVA binder relative to the mixed powder were caused to adhere on surfaces of the mixed powder by using a spray dryer in order to granulate the mixed powder.

The granulated powder was filled in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1340° C. was retained for 5 hours.

The composition was analyzed by X-ray fluorescence analysis. The results found that 0.18 parts by weight of manganese was contained in the composition represented by $(Ba_{0.860}Ca_{0.140}(Ti_{0.94}Zr_{0.06})O_3$. This means that the composition prepared by weighing matches the composition after sintering. The contents of the elements other than Ba, Ca, Ti, Zr, and Mn were below detection limits, i.e., less than 1 part by weight.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode 33 of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 110° C. Another rectangular prism piezoelectric material 1 was placed in a thermostatic chamber and the depolarization temperature Td was measured by a resonance-antiresonance method while increasing and decreasing the temperature. As a result, Td was found to be 95° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

A 0.5 kV/mm electric field was applied to the piezoelectric material 1 of the piezoelectric element in a portion sandwiched between the detection phase electrode 8 and the common electrode 2 at room temperature (25° C.) for 180 minutes to polarize the detection phase for the second time.

All of the non-drive phase electrodes 5 were shorted with a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.005 times the input voltage or less.

A rectangular prism having an aspect ratio of 10×2.5×0.5 was cut out from each of a drive phase electrode position and a detection phase electrode position of the piezoelectric material and the piezoelectric constant was determined by a resonance-antiresonance method. As a result, the piezoelectric constant in the detection phase electrode portion was 0.02 times the piezoelectric constant of the drive phase electrode portion.

Example 13

In Example 13, a piezoelectric material 1 containing 0.24 parts by weight of manganese in a composition represented by $(Ba_{0.813}Ca_{0.187})(Ti_{0.94}Zr_{0.06})O_3$ was prepared and an oscillatory wave motor control system was constructed as in Example 7. Barium titanate having an average particle diameter of 100 nm formed by a hydrothermal synthesis method (BT-01 produced by Sakai Chemical Industry Co., Ltd.) was used as the raw material and granulation was conducted by adding a binder, a dispersing agent, and an aqueous manganese acetate solution in a spray dryer. Barium titanate having an average particle diameter of 100 nm (BT-01 produced by Sakai Chemical Industry Co., Ltd.), calcium titanate having an average particle diameter of 300 nm (CT-03 produced by Sakai Chemical Industry Co., Ltd.), and calcium zirconate having an average particle diameter of 300 nm (CZ-03 produced by Sakai Chemical Industry Co., Ltd.) were weighed such that the molar ratio was 81.3:12.7:6.0.

The weighed powders were dry-mixed in a ball mill for 24 hours. To the resulting mixed powder, 0.24 parts by weight of manganese(II) acetate on a manganese metal basis and 3 parts by weight of a PVA binder relative to the mixed powder were caused to adhere on surfaces of the mixed powder by using a spray dryer in order to granulate the mixed powder.

The granulated powder was filled in a mold and pressed under 200 MPa of forming pressure with a press-molding machine to prepare a disk-shaped compact. The compact may be further pressed by using a cold isostatic press-molding machine.

The compact was placed in an electric furnace and sintered in an air atmosphere for a total of 24 hours during which a maximum temperature of 1380° C. was retained for 5 hours.

The composition was analyzed by X-ray fluorescence analysis. The results found that 0.24 parts by weight of manganese was contained in the composition represented by $(Ba_{0.813}Ca_{0.187})(Ti_{0.94}Zr_{0.06})O_3$. This means that the composition prepared by weighing matches the composition after sintering. The contents of the elements other than Ba, Ca, Ti, Zr, and Mn were below detection limits, i.e., less than 1 part by weight.

The resulting sintered piezoelectric material 1 was grinded into a ring shape having a substantially uniform thickness of 0.5 mm A silver paste was applied to both surfaces of the ring by screen-printing so as to form a common electrode 2 and polarizing electrodes by patterning. The interelectrode distance between the adjacent polarizing electrodes was 0.5 mm.

The ring-shaped piezoelectric material 1 was polarized in air using a DC power supply so that a 1 kV/mm electric field was applied. The atmosphere temperature was 100° C., the applied field was 1 kV/mm, and the voltage application time was 180 minutes at 100° C.

A rectangular prism having an aspect ratio of 10×2.5×0.5 was cut out at a position corresponding to a polarizing electrode 33 of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 105° C. Another rectangular prism piezoelectric material 1 was placed in a thermostatic chamber and the depolarization temperature Td was measured by a resonance-antiresonance method while increasing and decreasing the temperature. As a result, Td was found to be 90° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

A 0.5 kV/mm electric field was applied to the piezoelectric material 1 of the piezoelectric element in a portion sandwiched between the detection phase electrode 8 and the common electrode 2 at room temperature (25° C.) for 180 minutes to polarize the detection phase for the second time.

All of the non-drive phase electrodes 5 were shorted with a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system.

The oscillatory wave motor was operated by using the oscillatory wave motor control system prepared as such under a rotor load of 150 g·cm and a maximum rotation speed of 100 rpm. As a result, the voltage output from the detection phase was 0.007 times the input voltage or less.

A rectangular prism having an aspect ratio of 10×2.5×0.5 was cut out from each of a drive phase electrode position and a detection phase electrode position of the ring-shaped piezoelectric material and the piezoelectric constant was determined by a resonance-antiresonance method. As a result, the piezoelectric constant in the detection phase electrode portion was 0.01 times the piezoelectric constant of the drive phase electrode portion.

Comparative Example 1

In Comparative Example 1, a commercially available lead zirconate titanate (PZT) was used to make a ring-shaped piezoelectric material 1.

The ring-shaped piezoelectric material 1 was polarized in air using a DC power supply so that a 0.6 kV/mm electric field was applied. The atmosphere temperature was 100° C. and the voltage application time was 180 minutes at 100° C.

A rectangular prism having an aspect ratio of 10×2.5×0.5 was cut out at a position corresponding to a polarizing electrode 33 of the A-phase electrode of the ring-shaped piezoelectric material 1 sampled as a reference. The change in dielectric constant of this rectangular prism piezoelectric material was measured in a thermostatic chamber while elevating the temperature to determine the temperature Tc at which the dielectric constant was maximal. As a result, Tc was found to be 310° C. Another rectangular prism piezoelectric material 1 was placed in a thermostatic chamber and the depolarization temperature Td was measured by a resonance-antiresonance method while increasing and decreasing the temperature. As a result, Td was found to be 250° C.

An input/output wire 9 was press-bonded to the ring-shaped piezoelectric material 1 by using an anisotropic conductive film (ACF) at 200° C. Then an A-phase electrode 3 and a B-phase electrode 4 were formed with an electrode paste by screen printing to fabricate a piezoelectric element 20.

All of the non-drive phase electrodes 5 were shorted with a short-circuiting wire 10 so that they were all electrically connected to the common electrode 2 and the diaphragm 7.

The piezoelectric element 20 was bonded to the diaphragm 7 composed of stainless steel and a rotor was brought into pressure-contact with the piezoelectric element 20 to fabricate an oscillatory wave motor. The input/output wire 9 was connected to a driving control circuit to construct an oscillatory wave motor control system of Comparative Example 1.

The oscillatory wave motor was operated by using the oscillatory wave motor control system prepared as such under a rotor load of 150 g·cm and a maximum rotation speed of 100 rpm. As a result, the voltage output from the detection phase was 0.8 times the input voltage. For example, the output voltage was 70 to 120 V and the phase comparator in the phase detection circuit failed to output phase difference data.

A rectangular prism having an aspect ratio of 10×2.5×0.5 was cut out from each of a drive phase electrode position and a detection phase electrode position of the ring shaped piezoelectric material and the piezoelectric constant was determined by a resonance-antiresonance method. As a result, the piezoelectric constant in the detection phase electrode portion was 1.0 times the piezoelectric constant of the drive phase electrode portion.

Results of Examples and Comparative Example are shown in Table 1 below.

The legend in the table is as follows:
KNNT: (K,Na)(Nb,Ta)$O_3$
BNKT-BT: (Bi,Na,K)$TiO_3$—$BaTiO_3$
BTO-Mn: $BaTiO_3$—Mn
(I)BCTZ-Mn: $(Ba_{0.860}Ca_{0.140})(Ti_{0.94}Zr_{0.06})O_3$+0.18 parts by weight Mn
(II)BCTZ-Mn: $(Ba_{0.813}Ca_{0.187})(Ti_{0.94}Zr_{0.06})O_3$+0.24 parts by weight Mn
PZT: Pb(Zr,Ti)$O_3$ The input voltage in Examples 4 to 13 and Comparative Example 1 was 0.8 times that in Examples 1 to 3 or less when the rotor load was 150 g·cm and the maximum rotation speed was 100 rpm. However, in Comparative Example 1, the output voltage was also large, i.e., 0.8 times the input voltage.

The phase transition temperature Tr in Examples 4 to 9 was in a range of 0° C. or more and 35° C. or less. The phase transition temperature Tr in Examples 10 to 13 was not found in the range of −5° C. or more and 50° C. or less. With the piezoelectric materials 1 and oscillatory wave motor control systems used in Examples 10 to 13, the fluctuation in input voltage could be suppressed to ±10% when the rotor load was 150 g·cm and the maximum rotation speed was 100 rpm despite 5° C. or more of change in atmospheric temperature.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-141470, filed Jun. 27, 2011, which is hereby incorporated by reference herein in its entirety.

INDUSTRIAL APPLICABILITY

A piezoelectric element, a stator for an oscillatory wave motor, an oscillatory wave motor, and a driving control system according to the present invention can decrease the output voltage relative to the input voltage and are applicable to other various types of resonance devices such as

TABLE 1

| | Raw material | Tc/Td (° C.) | Second polarization temperature (° C.) | Second polarization electric field (kV/mm) | Output voltage/input voltage in detection phase | Piezoelectric constant of detection phase/piezoelectric constant of drive phase | Short-circuiting of non-drive phase with electrode paste |
|---|---|---|---|---|---|---|---|
| Example 1 | KNNT | 200/180 | | | 0.4 | 0.5 | Yes |
| Example 2 | BNKT-BT | 180/150 | | | 0.1 | 0.5 | Yes |
| Example 3 | BNKT-BT | 150/130 | | | 0.1 | 0.5 | No |
| Example 4 | BTO-Mn | 130/100 | | | 0.001 | 0.001 | Yes |
| Example 5 | BTO-Mn | 130/100 | 60 | 0.5 | 0.05 | 0.07 | Yes |
| Example 6 | BTO-Mn | 130/100 | 60 | 1.0 | 0.1 | 0.2 | Yes |
| Example 7 | BTO-Mn | 130/100 | 25 (room temperature) | 0.5 | 0.01 | 0.03 | Yes |
| Example 8 | BTO-Mn | 130/100 | 25 (room temperature) | 1.0 | 0.08 | 0.1 | Yes |
| Example 9 | BTO-Mn | 130/100 | 25 (room temperature) | 0.5 | 0.03 | 0.005 | No |
| Example 10 | (I)BCTZ-Mn | 110/95 | | | 0.001 | 0.001 | Yes |
| Example 11 | (II)BCTZ-Mn | 105/90 | | | 0.001 | 0.002 | Yes |
| Example 12 | (I)BCTZ-Mn | 110/95 | 25 (room temperature) | 0.5 | 0.005 | 0.02 | Yes |
| Example 13 | (II)BCTZ-Mn | 105/90 | 25 (room temperature) | 0.5 | 0.007 | 0.01 | Yes |
| Comparative Example 1 | PZT | 310/250 | — | | 0.8 | 1.0 | Yes | multilayer-type oscillatory wave motors and rod-shaped oscillatory wave motors in addition to ring-shaped oscillatory wave motors.

REFERENCE SIGNS LIST 1 piezoelectric material
2 common electrode
3 drive phase electrode (A-phase electrode)
4 drive phase electrode (B-phase electrode)
5 non-drive phase electrode
6, 725c rotor
7, 725b diaphragm
8 detection phase electrode
9 input/output wire
10 short-circuiting wire
11 first surface
12 second surface
20 piezoelectric element
30 stator for an oscillatory wave motor
33 polarizing electrode
40, 725 oscillatory wave motor
701 front lens group barrel
702 rear lens (focus lens)
711 mount
712 fixed barrel
713 linear guide barrel
714 front lens group barrel
715 cam ring
716 rear lens group barrel
717 cam roller
718 shaft screw
719 roller
720 rotation transmitting ring
722 roller
724 manual focus ring
726 wave washer
727 ball race
728 focus key
729 joint member
732 washer
733 low friction sheet

The invention claimed is:

1. A method for manufacturing a stator, the method comprising:
   polarizing a piezoelectric material at a polarization temperature;
   obtaining a piezoelectric element having the piezoelectric material and a pair of electrodes;
   bonding the piezoelectric element and an elastic member together;
   bonding the piezoelectric element and a power input/output wire together at a bonding temperature Tf; and
   re-polarizing, after the bondings, the piezoelectric element at the bonding temperature Tf or below.

2. The method for manufacturing a stator according to claim 1, wherein the piezoelectric element and the elastic member have a ring shape.

3. The method for manufacturing a stator according to claim 1, wherein the piezoelectric material has a lead content less than 1000 ppm.

4. The method for manufacturing a stator according to claim 1, wherein the piezoelectric material is a material containing potassium, sodium, niobium, and tantalum.

5. The method for manufacturing a stator according to claim 1, wherein the piezoelectric material is a barium titanate-based material.

6. The method for manufacturing a stator according to claim 5, wherein the piezoelectric material further contains manganese.

7. The method for manufacturing a stator according to claim 5, wherein the piezoelectric material further contains calcium, zirconium, and bismuth.

8. A method for manufacturing an oscillatory wave motor, the method comprising;
   providing a stator prepared by the manufacturing method according to claim 1; and
   providing a rotor in a manner such that the rotor is in contact with the stator.

9. The method for manufacturing a stator according to claim 1, wherein
   a treatment of the re-polarizing is performed at 60° C. or less.

10. The method for manufacturing a stator according to claim 1, wherein the piezoelectric element and the elastic member are bonded together at a bonding temperature being less than the Curie temperature of the piezoelectric material.

11. A method of manufacturing a stator, the method comprising:
    bonding a piezoelectric element, which includes a pair of electrodes and a piezoelectric material, and an elastic member together by using an epoxy adhesive at a bonding temperature less than Curie temperature of the piezoelectric material;
    bonding the piezoelectric element and a power input/output wire together at a bonding temperature Tf; and
    polarizing, after the bondings, the piezoelectric element at the bonding temperature Tf or below.

12. The method of manufacturing a stator according to claim 11, wherein the piezoelectric element and the elastic member have a ring shape.

13. The method of manufacturing a stator according to claim 11, wherein the piezoelectric material has a lead content less than 1000 ppm.

14. The method of manufacturing a stator according to claim 11, wherein the piezoelectric material is a material containing potassium, sodium, niobium, and tantalum.

15. The method of manufacturing a stator according to claim 11, wherein the piezoelectric material is a barium titanate-based material.

16. The method of manufacturing a stator according to claim 15, wherein the piezoelectric material further contains manganese.

17. The method of manufacturing a stator according to claim 15, wherein the piezoelectric material further contains calcium, zirconium, and bismuth.

18. A method for manufacturing an oscillatory wave motor, the method comprising;
    providing a stator prepared by the manufacturing method according to claim 11; and
    providing a rotor in a manner such that the rotor is in contact with the stator.

19. The method of manufacturing a stator according to claim 11,
    wherein a treatment of the polarizing is performed at 60° C. or less.

20. The method of manufacturing a stator according to claim 11, wherein the bonding temperature less than Curie temperature of the piezoelectric material is less than the depolarization temperature of the piezoelectric material.

* * * * *